(12) United States Patent
Maki et al.

(10) Patent No.: US 12,431,374 B2
(45) Date of Patent: Sep. 30, 2025

(54) INFORMATION ACQUISITION SYSTEM AND INFORMATION ACQUISITION METHOD

(71) Applicant: Tokyo Electron Limited, Tokyo (JP)

(72) Inventors: Junnosuke Maki, Koshi (JP); Koudai Higashi, Koshi (JP); Ryo Konishi, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 855 days.

(21) Appl. No.: 17/657,178

(22) Filed: Mar. 30, 2022

(65) Prior Publication Data
US 2022/0319886 A1 Oct. 6, 2022

(30) Foreign Application Priority Data

Mar. 31, 2021 (JP) ................ 2021-061608

(51) Int. Cl.
H01L 21/67 (2006.01)
H01L 21/687 (2006.01)

(52) U.S. Cl.
CPC .. *H01L 21/67259* (2013.01); *H01L 21/68742* (2013.01)

(58) Field of Classification Search
CPC ......... H01L 21/67259; H01L 21/68742; H01L 21/6715; H01L 21/67155; H01L 21/6838
USPC ........................................... 356/147
See application file for complete search history.

(56) References Cited

U.S. PATENT DOCUMENTS

2008/0212047 A1* 9/2008 Sugimoto ............... G03F 7/707
430/30
2016/0005636 A1* 1/2016 Ichinose ............. H01L 21/6838
269/21

FOREIGN PATENT DOCUMENTS

JP 2011-091071 A 5/2011
JP 2020-013932 A 1/2020

* cited by examiner

Primary Examiner — Md M Rahman
(74) Attorney, Agent, or Firm — Chrisman Gallo Tochtrop LLC

(57) ABSTRACT

An information acquisition system configured to acquire information upon a substrate processing apparatus configured to process a substrate held by a substrate holder includes a base body, instead of the substrate, held by the substrate holder; and multiple position sensors provided at the base body such that detection directions thereof are different from each other, and each configured to detect a position of a common detection target object located outside the base body.

11 Claims, 16 Drawing Sheets

HEIGHT OF LIFT PINS

INFORMATION ACQUISITION SYSTEM AND INFORMATION ACQUISITION METHOD

CROSS-REFERENCE TO RELATED APPLICATION

This application claims the benefit of Japanese Patent Application No. 2021-061608 filed on Mar. 31, 2021, the entire disclosure of which is incorporated herein by reference.

TECHNICAL FIELD

The various aspects and embodiments described herein pertain generally to an information acquisition system and an information acquisition method.

BACKGROUND

In a manufacturing process for a semiconductor device, a semiconductor wafer (hereinafter, simply referred to as a wafer) is transferred to a substrate processing apparatus while being accommodated in a carrier, and is subjected to a target processing. This processing may be, for example, a liquid processing such as development or formation of a coating film by supplying a coating liquid. During the liquid processing, a processing liquid is supplied from a nozzle onto the wafer accommodated in a cup. Patent Document 1 describes a developing apparatus equipped with a cup having an annular projection facing a bottom surface of the wafer.

Patent Document 1: Japanese Patent Laid-open Publication No. 2020-013932

SUMMARY

In one exemplary embodiment, an information acquisition system configured to acquire information upon a substrate processing apparatus configured to process a substrate held by a substrate holder includes a base body, instead of the substrate, held by the substrate holder; and multiple position sensors provided at the base body such that detection directions thereof are different from each other, and each configured to detect a position of a common detection target object located outside the base body.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
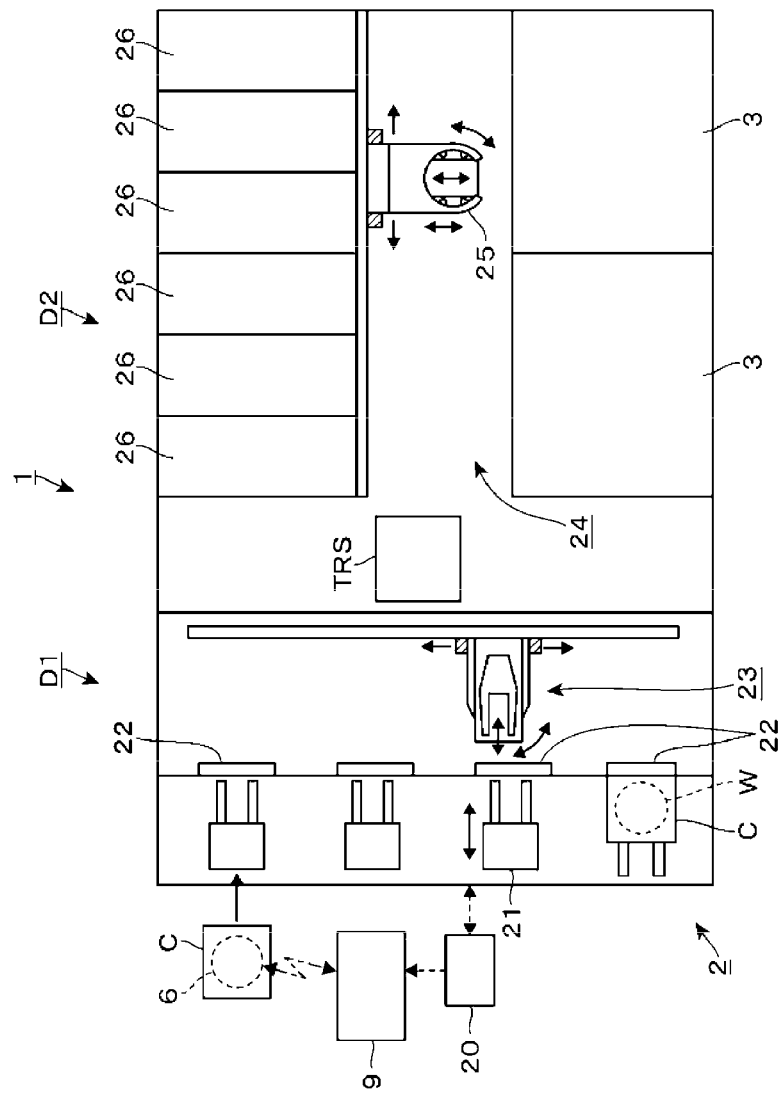
FIG. 1 is a plan view of a substrate processing apparatus constituting an information acquisition system according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

An information acquisition system 1 according to an exemplary embodiment of the present disclosure is shown in FIG. 1. The information acquisition system 1 includes a substrate processing apparatus 2, an inspection wafer 6, and an operation unit 9. The outline of the information acquisition system 1 will be first described. A resist film forming module 3 is provided in the substrate processing apparatus 2 to perform formation of a resist film and edge bead removal (EBR) on a wafer W which is a circular substrate. The EBR is a process in which a portion of a film (a resist film in the present exemplary embodiment) formed on an entire surface of the wafer W by discharging a solvent from a nozzle, the portion covering a periphery of the wafer W, is removed.

The inspection wafer 6 is transferred to the resist film forming module 3 instead of the wafer W by a transfer device of the substrate processing apparatus 2 to perform detection and imaging of various members positioned adjacent to the wafer W (the inspection wafer 6) by using various kinds of sensors and cameras mounted on the inspection wafer 6. Acquired detection signals and image data are wirelessly transmitted to the operation unit 9, and various calculations and signal processing and display are performed. Thus, an operator can inspect whether the positions of the adjacent members are appropriate. Specifically, the adjacent members include components of a cup 4 surrounding the wafer W, and a nozzle for EBR.

Hereinafter, the substrate processing apparatus 2 will be elaborated. The substrate processing apparatus 2 includes a carrier block D1 and a processing block D2. The carrier block D1 and the processing block D2 are arranged side by side in a left-right direction and connected to each other. The wafer W is transferred to the carrier block D1 by a non-illustrated transfer device for a carrier C while being accommodated in the carrier C serving as a transfer container. The carrier block D1 is equipped with a stage 21 on which the carrier C is placed. Further, the carrier block D1 is provided with an opening/closing unit 22 and a transfer device 23. The opening/closing unit 22 opens and closes a transfer opening formed at a sidewall of the carrier block D1. The transfer device 23 is configured to transfer the wafer W to/from the carrier C on the stage 21 through the transfer opening.

The processing block D2 includes a transfer path 24 for the wafer W, extending in the left-right direction, and a transfer device 25 provided in the transfer path 24. The wafer W is transferred between the carrier C and each of processing modules provided in the processing block D2 by the transfer device 25 and the aforementioned transfer device 23. The processing modules are arranged in the left-right direction on the front side and the rear side of the transfer path 24. The processing modules on the rear side are heating modules 26, and these heating modules 26 are configured to perform a heating treatment for removing a solvent in a resist film. The processing modules on the front side are resist film forming modules 3. Furthermore, provided at a position of the transfer path 24 on the side of the carrier block D1 is a transit module TRS in which the wafer W is temporarily placed. The wafer W is transferred between the carrier block D1 and the processing block D2 via the transit module TRS.

Figure 2:
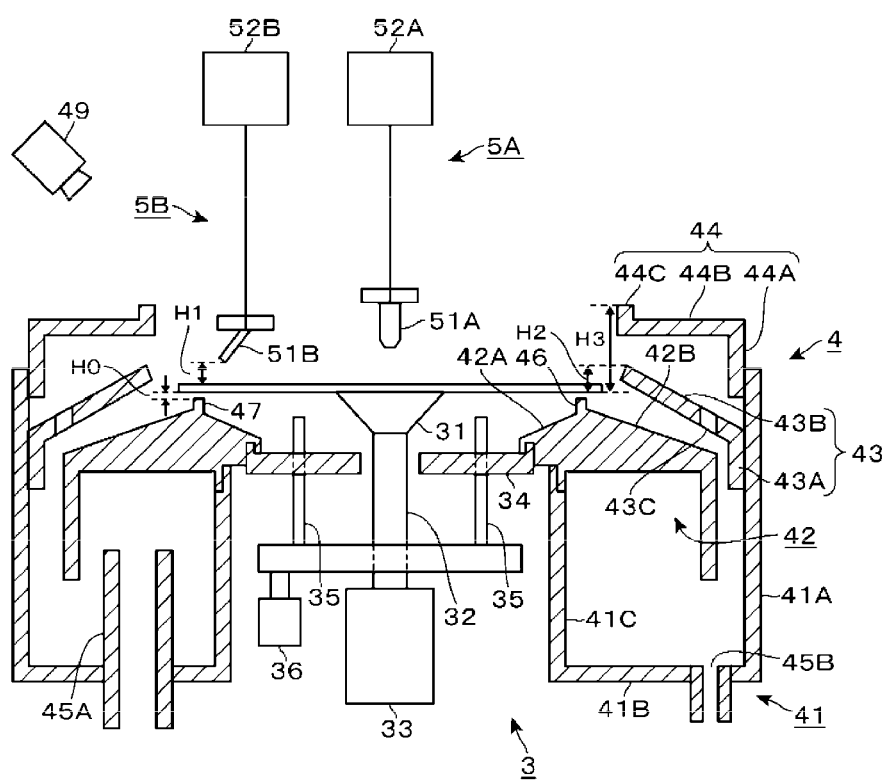
FIG. 2 is a longitudinal front view of a resist film forming module belonging to the substrate processing apparatus.

Now, the resist film forming module 3 will be described with reference to a longitudinal front view of FIG. 2 and a plan view of FIG. 3. The resist film forming module 3 includes a spin chuck 31 serving as a substrate holder, and the spin chuck 31 is configured to attract a central portion of a rear surface of the wafer W to hold the wafer W horizontally. The spin chuck 31 is connected to a rotation device 33 via a shaft 32 which extends vertically, and the wafer W held by the spin chuck 31 is rotated around a vertical axis by the rotation device 33. Further, a circular fence plate 34 surrounding the shaft 32 is provided, and three lift pins 35 (only two of them are shown in FIG. 2) vertically extending to penetrate the fence plate 34 are provided. The lift pins 35 are moved up and down by a lifting device 36 including a pulse motor, and the wafer W is transferred between the spin chuck 31 and the aforementioned transfer device 25. The lift pins 35 constitute a support configured to support the wafer W and the inspection wafer 6.

The cup 4 having a circular shape is provided so as to surround the wafer W from below the periphery of the wafer W held by the spin chuck 31 to the side of the wafer W. The cup 4 includes a cup main body 41, a lower guide member 42, a middle guide member 43, and an upper guide member 44. The cup main body 41 is provided to form an annular recess along the circumference of the wafer W, and receives a processing liquid (a resist and the solvent) falling or scattered from the wafer W. Individual portions constituting the cup main body 41 is shown as an outer cylindrical portion 41A, a bottom main body 41B, and an inner cylindrical portion 41C. The outer cylindrical portion 41A and the inner cylindrical portion 41C are cylindrical members standing upright, and they form sidewalls of the annular recess. The bottom main body 41B is a horizontal annular plate connecting a lower end of the outer cylindrical portion 41A and a lower end of the inner cylindrical portion 41C, and forms a bottom of the annular recess. An exhaust pipe 45A for exhausting the inside of the cup 4 is provided at the bottom main body 41B, and a drain port 45B for draining the processing liquid from the recess is provided thereat.

Next, the lower guide member 42 will be described. This lower guide member 42 is an annular member formed from above a periphery of the aforementioned fence plate 34 to be widened toward the outer cylindrical portion 41A while passing through the inner cylindrical portion 41C. The lower guide member 42 is located below the wafer W held by the spin chuck 31. A top surface of the lower guide member 42 is formed as inclined surfaces 42A and 42B, and the inclined surface 42A is located closer to a center of the cup 4 than the inclined surface 42B is. The inclined surface 42A ascends when it goes outwards, and the inclined surface 42B descends when it goes outwards, so that they form a mountain shape on a longitudinal cross section of the lower guide member 42. The inclined surface 42B guides the processing liquid attached thereto after falling or being scattered from the wafer W so that the processing liquid flows down onto the bottom main body 41B.

A top portion of the mountain shape formed by the inclined surfaces 42A and 42B protrudes upwards to form an annular projection 46, and this annular projection 46 conforms to the circumference of the wafer W placed on the aforementioned spin chuck 31, and is positioned close to the periphery of the wafer W. The annular protrusion 46 suppresses the processing liquid supplied onto a front surface of the wafer W from flowing to the rear surface of the wafer W to adhere to a central position of the rear surface of the wafer W, or suppresses mist of the processing liquid from adhering to the central position of the rear surface of the wafer W. The height of the lower guide member 42 is adjustable with respect to the fence plate 34 and the cup main body 41, and, therefore, the height of the annular projection 46 is adjustable with respect to the bottom surface of the wafer W. In FIG. 2, H0 denotes a distance between the annular protrusion 46 and the bottom surface of the wafer W (referred to as a cup clearance).

The middle guide member 43 constituting the cup 4 is an annular member disposed to surround the wafer W when viewed from the top, and includes a vertical wall 43A mounted to an inner circumference surface of the outer cylindrical portion 41A; and an inclined portion 43B extending obliquely upwards from an upper end of the vertical wall 43A toward a center side of the cup 4. Further, a through hole 43C for liquid drain is formed through the inclined portion 43B in a vertical direction. Moreover, the upper guide member 44 constituting the cup 4 is also an annular member disposed to surround the wafer W when viewed from the top. The upper guide member 44 includes a vertical wall 44A mounted to the inner circumference surface of the outer cylindrical portion 41A, a horizontal portion 44B extending horizontally from an upper end of the vertical wall toward a central portion of the cup 4, and a cylindrical inlet wall 44C extending vertically upwards from a leading end of the horizontal portion 44B. The vertical wall 44A is provided above the vertical wall 43A of the middle guide member 43, and the horizontal portion 44B is located above the inclined portion 43B of the middle guide member 43.

As the upper guide member 44 and the middle guide member 43 are mounted to the outer cylindrical portion 41A at multiple positions in a circumferential direction, height and inclination thereof can be changed. Further, a camera 49 configured to image the above-described cup 4 from diagonally above is also provided. Image data of the upper side (that is, the upper guide member 44) of the cup 4 viewed from above can be acquired by the camera 49 serving as a first imaging unit.

Now, a resist supply device 5A and an EBR processing device 5B provided in the resist film forming module 3 will be described. The resist supply device 5A includes a resist supply nozzle 51A, a resist supply 52A, an arm 53A, a moving mechanism 54A, and a standby member 55A. The resist supply nozzle 51A is configured to discharge a resist force-fed from the resist supply 52A vertically downwards. The arm 53A supports the resist supply nozzle 51A, and is configured to be moved up and down and horizontally by the moving mechanism 54A. The standby member 55A opened upwards is provided outside the cup 4, and the resist supply nozzle 51A is moved between the inside of the opening of the standby member 55A and the inside of the cup 4 by the moving mechanism 54A. The resist supply nozzle 51A moved to the inside of the cup 4 discharges the resist onto a central portion of the wafer W being rotated, so that a resist film is formed on the entire surface of the wafer W by spin coating.

The EBR processing device 5B is provided with a solvent supply nozzle 51B, a solvent supply 52B, an arm 53B, a moving mechanism 54B, and a standby member 55B. The solvent supply nozzle 51B is a nozzle for EBR, and is configured to discharge a solvent force-fed from the solvent supply 52B diagonally downwards from a center side of the wafer W to a peripheral side thereof. That is, the solvent is discharged in an inclined direction with respect to the vertical direction. The arm 53B supports the solvent supply nozzle 51B, and is configured to be moved up and down and horizontally by the moving mechanism 54B. The standby member 55B opened upwards is provided outside the cup 4, and the solvent supply nozzle 51B is moved between the inside of the opening of the standby member 55B and a processing position above the wafer W within the cup 4. In FIG. 3, the solvent supply nozzle 51B moved to the processing position is indicated by a solid line, and the aforementioned EBR is carried out as the solvent is discharged onto the wafer W being rotated from the solvent supply nozzle 51B at this processing position.

For example, the solvent supply nozzle 51B is mounted to the arm 53B such that the height thereof is adjustable. Thus, a distance (referred to as a nozzle clearance) H1 between the solvent supply nozzle 51B at the processing position and the front surface of the wafer W shown in FIG. 2 is adjustable, and by changing this nozzle clearance H1, a liquid landing position of the solvent discharged from the solvent supply nozzle 51B on the wafer W is changed. In addition, although shown only in FIG. 3, an illumination device 48 which can radiate light toward the cup 4 is provided near the cup 4. When imaging the solvent supply nozzle 51B by the camera 82, the light is radiated to the solvent supply nozzle 51B by the illumination device 48.

The substrate processing apparatus 2 is equipped with a controller 20 including a computer (see FIG. 1), and a program stored in a recording medium such as a compact disk, a hard disk, a memory card, or a DVD is installed. Instructions (processes) are written in the program such that control signals are outputted to the individual components of the substrate processing apparatus 2 by the installed program. Then, the transfer of the wafer W by the transfer devices 23 and 25 and the processings on the wafer W by the respective processing modules are performed in response to these control signals.

The resist film forming module 3 will be further explained. The height from the bottom surface of the wafer W held by the spin chuck 31 to an upper end of the inclined portion 43B of the middle guide member 43 is referred to as an middle guide member height H2, and the height from the bottom surface of the wafer W on the spin chuck 31 to an upper end of the inlet wall 44C of the upper guide member 44 is referred to as an upper guide member height H3 (see FIG. 2). That is, these guide member heights (the middle guide member height H2 and the upper guide member height H3) are heights from a top surface (placing surface for the wafer W) of the spin chuck 31 to the edges of the openings of the middle guide member 43 and the upper guide member 44.

The upper guide member 44 and the middle guide member 43 may be mounted to the cup main body 41 at abnormal heights due to an error that has occurred when the cup 4 is assembled or adjusted. This height abnormality includes a case where the height of only a part of the upper guide member 44 or the middle guide member 43 in the circumferential direction becomes abnormal as they are mounted to the cup main body 41 slantly. In such a state where the height is abnormal, required exhaust performance may not be achieved, resulting in unsatisfactory processing of the wafer W, or the mist of the processing liquid may be scattered to the outside of the cup 4. Moreover, when the height of the upper guide member 44 is abnormal, there is a concern that the upper guide member 44 may interfere with each nozzle passing over the cup 4.

One of inspections performed by using the aforementioned inspection wafer 6 may be acquiring the middle guide member height H2 and the upper guide member height H3. These guide member heights H2 and H3 are acquired as the upper end of the inclined portion 43B which forms the middle guide member 43 (hereafter, referred to as an upper end of the middle guide member 43) and the upper end of the inlet wall 44C which forms the upper guide member 44 (hereinafter, referred to as an upper end of the upper guide member 44) are respectively detected by a proximity sensor 57 mounted on the inspection wafer 6. Further, in acquiring the guide member heights H2 and H3, a contact sensor 58 mounted on the inspection wafer 6 is also used, so that the position of the bottom surface of the wafer W on the spin chuck 31 is specified. This contact sensor 58 is, for example, an acceleration gyro sensor.

As will be elaborated later, three proximity sensors 57 are provided along the circumference of the inspection wafer 6. Three points of each of the upper end of the middle guide member 43 and the upper end of the upper guide member 44 in the circumferential direction are detected by the proximity sensors 57. Thus, three guide member heights H2 and three guide member heights H3 are acquired. In this way, each of the middle guide member 43 and the upper guide member 44 respectively surrounding the wafer W is considered to be a common detection target object to the three proximity sensors 57 serving as position sensors. In addition, the guide members 43 and 44 (the middle guide member 43 and the upper guide member 44) are located outside the wafer W which is lifted up and down on the spin chuck 31 by the lift pins 35 when viewed from the top. For this reason, as will be described later, the guide members 43 and 44 are located outside a base body 61 of the inspection wafer 6 that is moved up and down on the spin chuck 31 by the lift pins 35 when viewed from the top.

Now, the reason for detecting the multiple points of the detection target object surrounding the wafer W by the plurality of (three in this example) proximity sensors 57 as described above will be explained. It is because, as described above, there are cases in which the middle guide member 43 and/or the upper guide member 44 are mounted while being inclined, or the top surface of the spin chuck 31 is inclined with respect to the horizontal plane, so the level of the top surface may be different at respective positions thereof. That is, the spin chuck 31 may be inclined with respect to each member constituting the cup 4. For this reason, the guide member heights H2 and H3 may be different at respective positions in the circumferential direction of the cup 4. The heights may be normal at some points in the circumferential direction, whereas the heights may be abnormal at some other points. In view of this, by detecting the plurality of points and acquiring the guide member heights H2 and H3 from each detection point as described above, abnormality in the heights of the middle guide member 43 and the upper guide member 44 can be accurately detected. Based on the obtained three middle guide member heights H2 and three upper guide member heights H3, an operator can, if necessary, adjust the heights of the upper guide member 44 and/or the middle guide member 43 in the circumferential direction. Thus, occurrence of a process resulted from the height abnormality of the upper guide member 44 and the middle guide member 43 can be prevented in advance.

Further, the inspection wafer 6 also serves to perform imaging with cameras 81 and 82 mounted thereon, and to acquire image data for detecting the clearances H0 and H1 (the cup clearance H0 and the nozzle clearance H1). If a processing is performed on the wafer W in the state that the cup clearance H0 is inappropriate, the annular projection 46 may come into contact with the wafer W to damage the rear surface of the wafer W, or the annular projection 46 may be distanced too far away from the wafer W, resulting in a failure to perform its role sufficiently. In addition, if the processing is performed on the wafer W in the state that the nozzle clearance H1 is inappropriate, the solvent supply nozzle 51B may come into contact with the wafer W to inflict a damage on the wafer W, or the liquid landing point may become abnormal, which in turn causes abnormality in the width of the target area of the resist film to be removed. The operator adjusts, when necessary, the height of the lower guide member 42 provided with the annular projection 46 and/or the height of the solvent supply nozzle 51B based on the acquired clearances H0 and H1. Therefore, the occurrence the aforementioned abnormalities can be prevented in advance.

Further, the inspection wafer 6 is equipped with a contact-type interference detector. It is detected whether this interference detector interferes with the annular projection 46 serving as a first interference detection target member and the solvent supply nozzle 51B at the processing position serving as a second interference detection target member. That is, acquisition of information upon whether or not the cup clearance H0 and the nozzle clearance H1 described above are smaller than appropriate ranges can be carried out through this detection of the interference.

Figure 4:
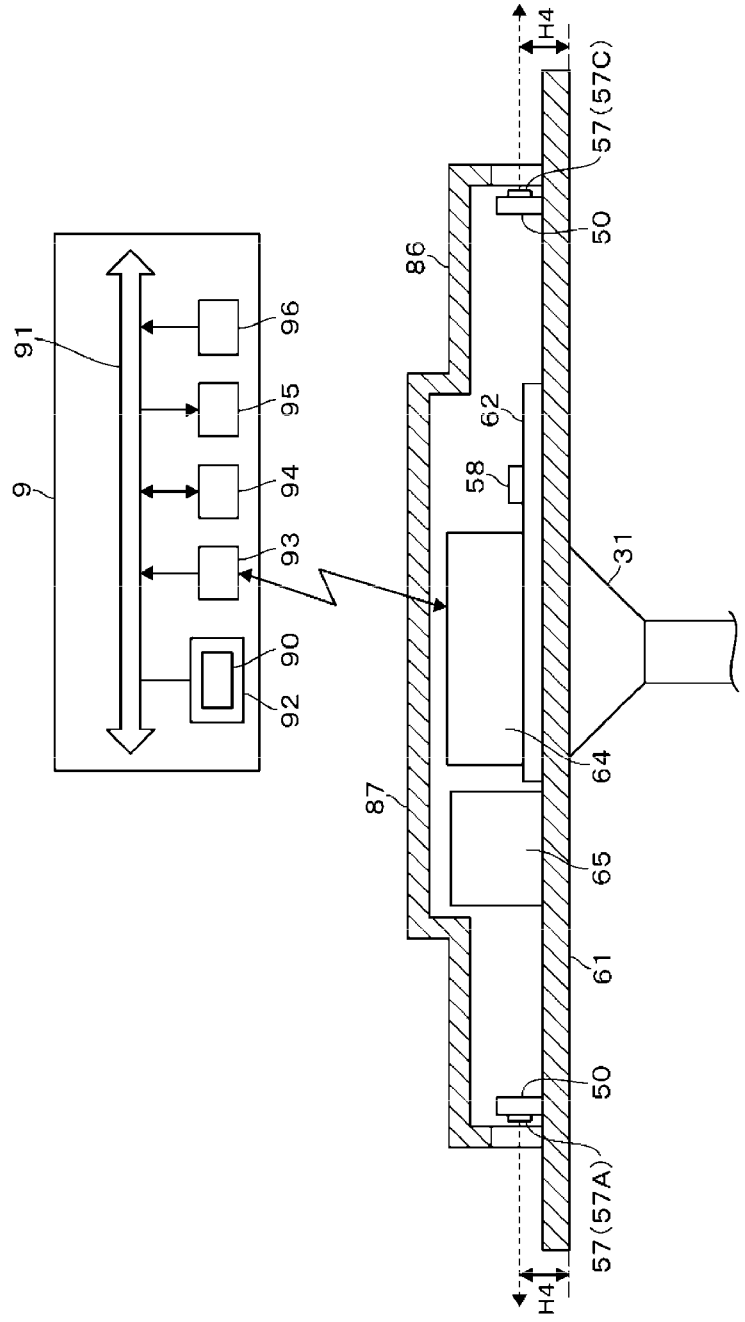
FIG. 4 is an explanatory diagram illustrating an inspection wafer and an operation unit constituting the information acquisition system.
Figure 5:
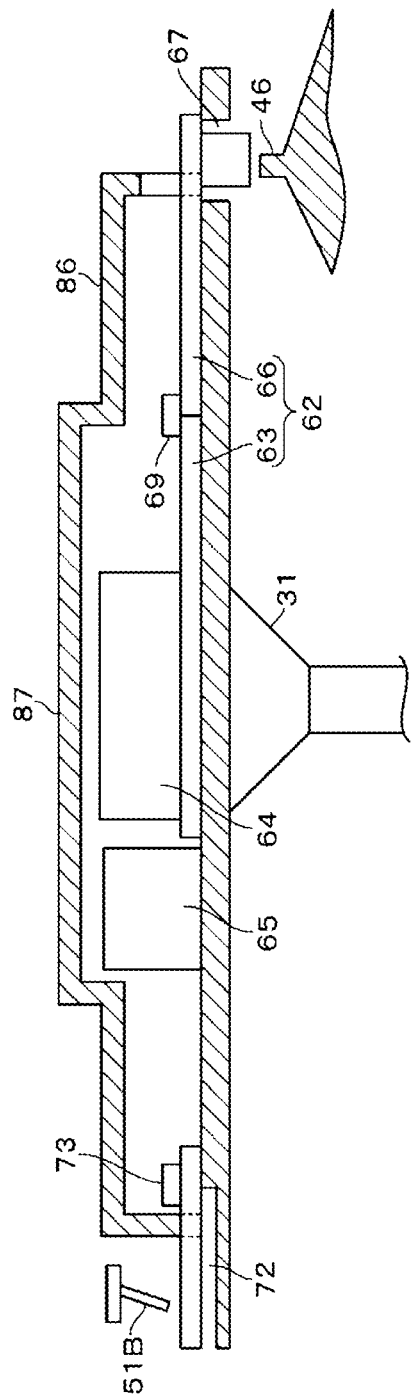
FIG. 5 is a longitudinal side view of the inspection wafer.
Figure 6:
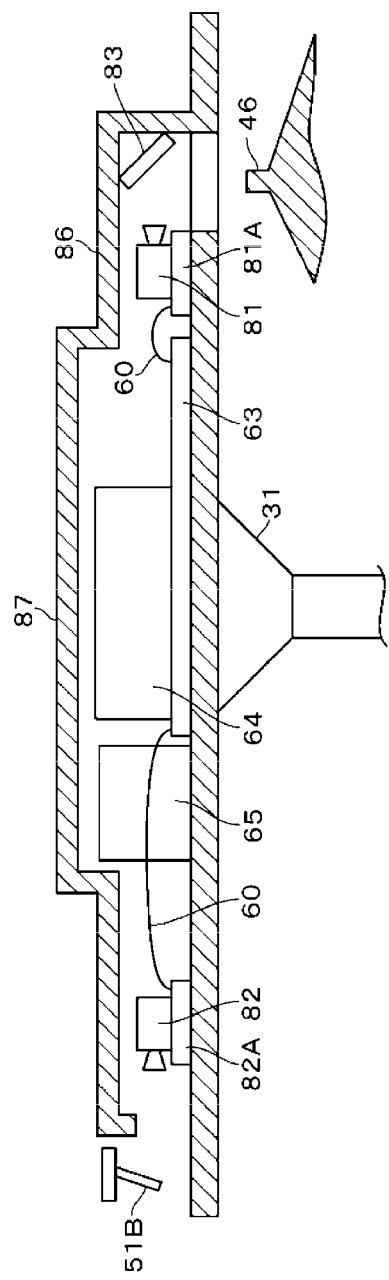
FIG. 6 is a longitudinal side view of the inspection wafer.
Figure 7:
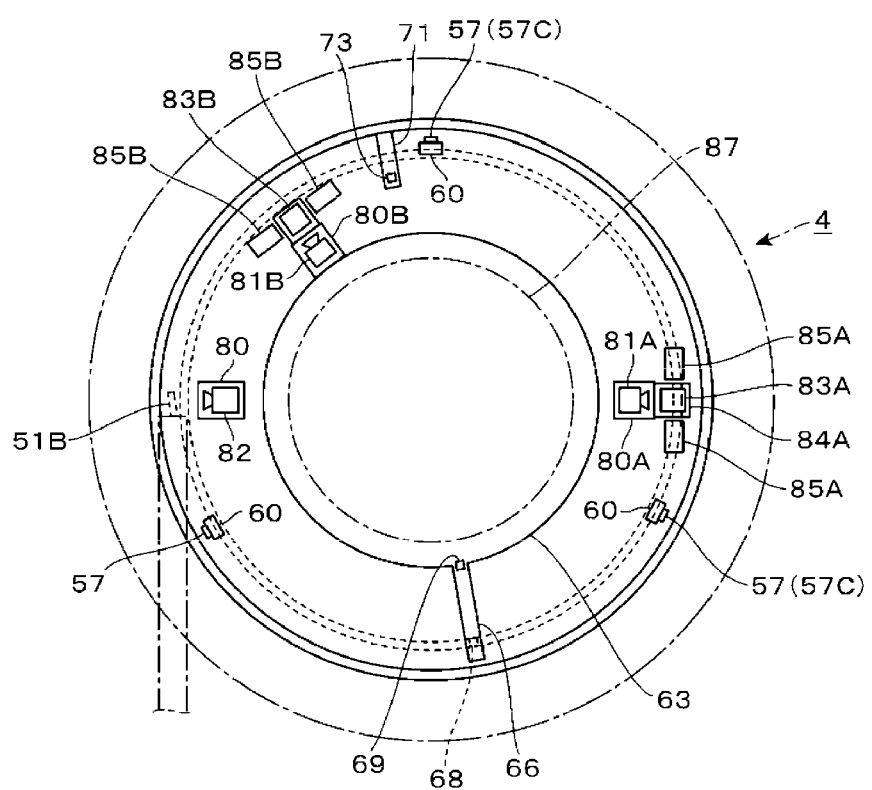
FIG. 7 is a plan view of the inspection wafer.

Hereinafter, the structure of the inspection wafer 6 will be described with reference to longitudinal side views of FIG. 4, FIG. 5 and FIG. 6 and a plan view of FIG. 7. FIG. 4 to FIG. 6 show longitudinal sides at different positions. In FIG. 7, some components shown in FIG. 4 to FIG. 6 are omitted. The inspection wafer 6 includes the circular base body 61 and a substrate 62. The base body 61 is a board of the same size as the wafer W, and a bottom surface of the base body 61 is formed as a flat surface, the same as the bottom surface of the wafer W. Therefore, like the wafer W, the base body 61 can be transferred by the transfer devices 23 and 25 and attracted to and held by the spin chuck 31. That is, the inspection wafer 6 is attracted to and held by the spin chuck 31 instead of the wafer W, and FIG. 5 to FIG. 7 show the inspection wafer 6 in such a state of being attracted to and held by the spin chuck 31.

The substrate 62 is stacked on the base body 61. The substrate 62 is equipped with a main body 63 provided on a central portion of the base body 61. Although the main body 63 is shown to be of the circular shape in FIG. 7 and FIG. 8 to be described later for convenience of illustration, the shape of the main body 63 is not limited to the circular shape but can be any of various shapes. Various circuit components and equipment are provided on the main body 63, and they are indicated as a component group 64 as a whole in the drawings. The components and equipment constituting the component group 64 include a CPU, communication equipment configured to wirelessly transmit and receive various data (including signals), and so forth. The data acquired by each sensor or camera can be wirelessly transmitted to the operation unit 9 by this communication equipment. In addition, a signal serving as a trigger for acquiring the data can be transmitted to each camera or each sensor via this communication equipment. Moreover, although the cameras 81 and 82, the proximity sensor 57, and the like are mounted on a substrate other than the substrate 62 as will be described later, the transmission of the data to the operation unit 9 and the reception of the trigger signal are enabled via a wire 60 that connects the substrates.

The contact sensor 58 is provided on the main body 63. Further, a battery 65 for supplying a power to the component group 64, each sensor, each camera, and an illumination device 85 to be described later is provided on a central portion of the base body 61. The battery 65 and the component group 64 are disposed on the central portion of the main body 61.

Figure 8:
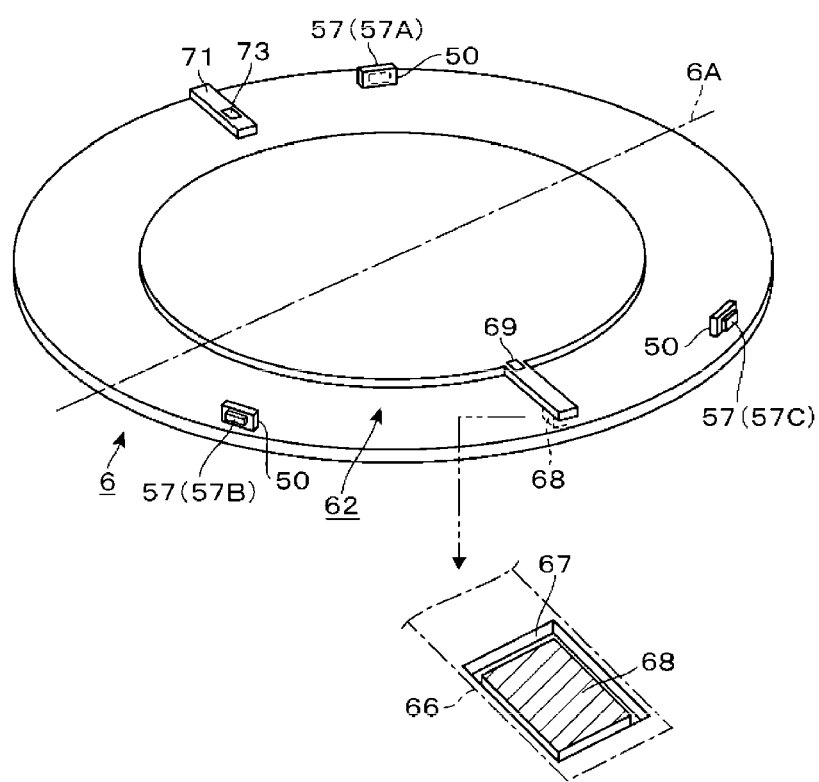
FIG. 8 is a perspective view of the inspection wafer.

Reference is made to FIG. 8 which shows a schematic perspective view of the base body 61. The aforementioned three proximity sensors 57 are provided at a periphery of the base body 61. For convenience' sake, the three proximity sensors 57 may sometimes be distinguished from each other by being assigned reference numerals 57A, 57B, and 57C, respectively. Each proximity sensor 57 is, for example, a reflective optical sensor, and each radiates an infrared laser beam toward the outside of the base body 61 along the diametrical direction of the base body 61, and outputs a detection signal based on reflected light from the detection target object. Thus, detection directions by the three proximity sensors 57 are all different, and are directed outwards in the diametrical direction of the base body 61. The three proximity sensors 57 are equi-spaced from the center portion of the base body 61, and are arranged at a regular distance therebetween along the circumferential direction of the base body 61. Further, reference numerals 50 in the drawing indicate boards standing upright to support the proximity sensors 57 on the base body 61, and they are arranged while being spaced apart from each other in the circumferential direction according to the layout of the proximity sensor 57.

In FIG. 8, an imaginary line along the diameter of the base body 61 is denoted by 6A. As described above, by arranging the proximity sensors 57 apart from each other in the circumferential direction, the proximity sensors 57 are respectively located in one region and the other region of the base body 61 bisected by the imaginary line 6A. This layout of the proximity sensors 57 is designed to carry out abnormality detection so that the influence of the inclination of the spin chuck 31 on the middle guide member 43 and the upper guide member 44 described above may be suppressed. To be more specific, it is assumed that the inspection wafer 6 is disposed such that the one region of the base body 61 is low and the other region is high as the top surface of the spin chuck 31 is tilted with respect to the horizontal plane. However, even in that case, since presence or absence of height abnormality regarding the middle guide member 43 and the upper guide member 44 can be determined based on the guide member heights H2 and H3 respectively obtained from the proximity sensor 57 in the one region and the proximity sensor 57 in the other region, it is possible to suppress occurrence of the determination error due to the inclination of the top surface of the spin chuck 31. Therefore, the accuracy of the abnormality detection can be improved.

In addition, the laser beam radiated from the proximity sensor 57 is indicated by an arrow of a dotted line in FIG. 4. In addition, in FIG. 4, a height between a position where an object can be detected by this laser beam and the bottom surface of the base body 61 is indicated as a correction height H4. This correction height H4 is previously acquired by using a jig or the like in order to use it for calculation of the guide member heights H2 and H3.

The substrate 62 on the base body 61 will be further described. The main body 63 forming the substrate 62 is fixed to the base body 61. A part of a periphery of the main body 63 extends toward the periphery of the main body 63 to form a thin and long beam-shaped body 66 along the diametrical direction of the base body 61. A through hole 67 is formed at a peripheral portion of the base body 61 to overlap a leading end of the beam-shaped body 66, and this through hole 67 is formed through the base body 61 in a thickness direction thereof. The through hole 67 forms a connection path which connects one side (upper side) and the other side (lower side) of the base body 61 in the vertical direction thereof.

An enlargement of components around the through hole 67 is provided at the end of an arrow in FIG. 8. A projection 68 is provided on a bottom surface of the beam-shaped body 66 on the leading end side thereof. The projection 68 protrudes downwards and is inserted in the through hole 67. A leading end (lower end) of this projection 68 is located below a bottom surface of the main body 63 and protrudes, e.g., about 1 mm from the bottom surface of the main body 63 (see FIG. 5). Further, the projection 68 is located slightly apart from the leading end of the beam-shaped body 66 toward a base end side, and the leading end of the beam-shaped body 66 is located closer to the edge of the base body 61 than the through hole 67 is. As the projection 68 and the through hole 67 are arranged in this way, a portion of the beam-shaped body 66 closer to the base end side than the through hole 67 and a portion of the beam-shaped body 66 closer to the leading end side than the through hole 67 are in contact with and supported by the base body 61. That is, a top surface region of the base body 61 including the edge of the through hole 67 supports the beam-shaped body 66.

The beam-shaped body 66 serving as a first beam-shaped body is formed as a so-called cantilever, and is configured as a first interference detector configured to acquire information on the height of the annular projection 46. To be more specific, the bottom surface of the beam-shaped body 66 is not fixed to the base body 61, and has flexibility in a vertical direction (thickness direction of the base body 61). Since the main body 63 to which the beam-shaped body 66 is connected is fixed to the base body 61, the base end of the beam-shaped body 66 is fixed to the base body 61. Thus, one end of the beam-shaped body 66 is fixed to the central portion of the base body 61, while the other end thereof extending toward the periphery of the base body 61 is movable with respect to the base body 61. That is, the beam-shaped body 66 is partially fixed to the base body 61. A strain gauge (strain sensor) 69 is provided on the base end (one end) of the beam-shaped body 66. The strain gauge 69 serving as a first signal acquisition unit constitutes a Wheatstone bridge circuit together with the components included in the component group 64, and a voltage signal outputted from the circuit is wirelessly transmitted to the operation unit 9 as a detection signal.

Figure 9:
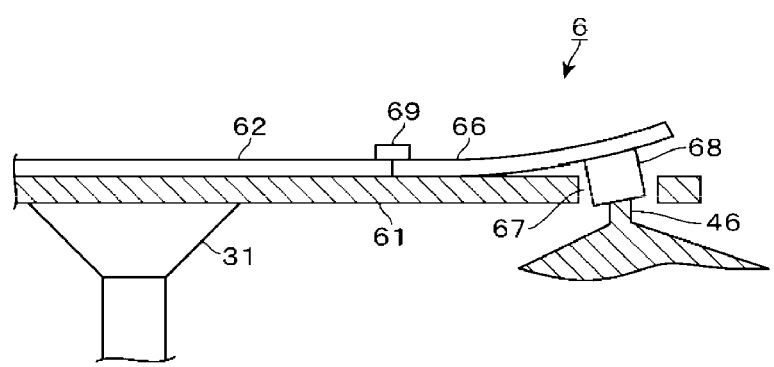
FIG. 9 is an explanatory diagram illustrating an operation of a first beam-shaped body provided in the inspection wafer.

When the base body 61 is attracted by the spin chuck 31, the projection 68 of the beam-shaped body 66 is located above the annular projection 46. Since both the bottom surface of the wafer W and the bottom surface of the base body 61 are the flat surfaces as stated above, they have the same height when disposed on the spin chuck 31. Therefore, when the aforementioned cup clearance H0 is equal to or less than a reference value so the wafer W and the annular projection 46 interfere with each other, interference also occurs between the annular projection 46 and the protrusion 68 of the inspection wafer W, as shown in FIG. 9. If the projection 68 interferes in this way, the beam-shaped body 66 is transformed so that the leading end side thereof is pushed upwards. The strain gauge 69 is also transformed due to the transformation of the beam-shaped body 66, and a signal outputted from the Wheatstone bridge circuit also changes according to a resistance variation of the strain gauge 69 caused by the transformation of the strain gauge 69. Therefore, since presence or absence of the interference between the annular protrusion 46 and the protrusion 68 can be detected by monitoring this signal, it is possible to determine whether or not the interference between the wafer W and the annular projection 46 occurs.

Further, the configuration in which the beam-shaped body 66 is supported by the base body 61 in contact with it is adopted to suppress the annular projection 46 from undergoing plastic deformation so that the leading end of the beam-shaped body 66 sags, which may be caused when the annular projection 46 collides with the beam-shaped body 66 and the beam-shaped body 66 vibrates up and down. Further, when only a part of the annular projection 46 in the circumferential direction is high and it comes into contact with the beam-shaped body 66 from a transversal direction, the base end side of the beam-shaped body 66 is suppressed from being drawn downwards because the base end of the beam-shaped body 66 is supported at the base body 61. A force directed downwards is converted into a force which pushes the leading end side of the beam-shaped body 66 upwards. That is, the transformation amount of the leading end of the beam-shaped body 66 in the upward direction is increased, so that the detection accuracy can be improved.

Moreover, on a peripheral portion of the top surface of the base body 61, a notch is provided at a position different from the position where the beam-shaped body 66 is provided in the circumferential direction. A base end of a beam-shaped body 71 which is a second beam-shaped body is fixed to the base body 61 at a position closer to the center of the base body 61 than the notch is. A leading end side of the beam-shaped body 71 is formed to be long and thin so as to extend on the notch along the diametrical direction of the base body 61. Therefore, a leading end of the beam-shaped body 71 is in a state where it floats from the base body 61. That is, a gap formed by the notch exists between the base body 61 and the leading end of the beam-shaped body 71, and this gap is denoted by a reference numeral 72.

Like the beam-shaped body 66, the beam-shaped body 71 is formed as a so-called cantilever, and is configured as a second interference detector configured to acquire information on the height of the solvent supply nozzle 51B at the processing position. By being provided on the gap 72 as stated above, the leading end of the beam-shaped body 71 is configured to be vertically movable. A strain gauge 73 is provided on a base end of the beam-shaped body 71. The strain gauge 73 serving as a second signal acquisition unit constitutes a Wheatstone bridge circuit together with the components included in the component group 64, and a voltage signal outputted from the circuit is wirelessly transmitted to the operation unit 9 as a detection signal.

Figure 10:
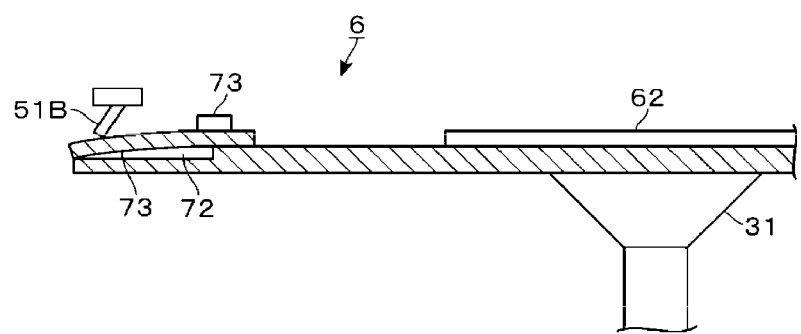
FIG. 10 is an explanatory diagram illustrating an operation of a second beam-shaped body provided in the inspection wafer.

If the spin chuck 31 is rotated in the state that the inspection wafer 6 is attracted to the spin chuck 31, the beam-shaped body 71 may interfere with the lower end of the solvent supply nozzle 51B when the nozzle clearance H1 is equal to or less than a reference value, as shown in FIG. 10. Due to such interference, the leading end side of the beam shape body 71 is pressed downwards through the gap 72, so that the gap 72 is transformed and narrowed. As the beam-shaped body 71 is transformed, the strain gauge 73 is also transformed, which causes the signal outputted from the Wheatstone bridge circuit including the strain gauge 73 to fluctuate. Thus, by monitoring this signal, presence or absence of the interference between the solvent supply nozzle 51B and the beam-shaped body 71 can be detected, and it can be determined whether the processing position of the solvent supply nozzle 51B is appropriate.

On the periphery of the base body 61, there are provided substrates 80, 80A and 80B on which cameras 82, 81A and 81B are respectively mounted. The beam-shaped bodies 66 and 71, the proximity sensors 57A, 57B, and 57C, and the cameras 82, 81A and 81B are located apart from each other in the circumferential direction of the base body 61. The fields of view of the cameras 82, 81A and 81B are directed toward the periphery of the base body 61, and the camera 82 serving as the second imaging unit is configured to image the solvent supply nozzle 51B from the center side of the base body 61. By disposing the proximity sensors 57 as described above, the camera 82 is positioned between one of the three proximity sensors 57 and another one of the three proximity sensors 57 in the circumferential direction of the base body 61. Likewise, the beam-shaped bodies 66 and 71 are also located between one proximity sensor and another proximity sensor in the circumferential direction of the base body 61.

The cameras 81A and 81B are configured to image the annular projection 46. A mirror 83A is disposed on an optical axis of the camera 81A, and a through hole 84A is formed in the base body 61. When the inspection wafer 6 is held by the spin chuck 31, the through hole 84A is located on the annular projection 46, and a part of a top surface of the annular projection 46 in the circumferential direction is reflected on the mirror 83A through the through hole 84A. The camera 81A can image the part of the top surface of the annular projection 46 reflected on the mirror 83A. In addition, two illumination devices 85A are provided in the base body 61. These illumination devices 85A are arranged with the through hole 84A therebetween in the circumferential direction of the base body 61, and each radiates light downwards. When the imaging is performed by the camera 81A, the light is radiated to a target object below from each illumination device 85A.

Like the mirror 83A, the through hole 84A, and the illumination devices 85A corresponding to the camera 81A, a mirror, a through hole, and illumination devices corresponding to the camera 81B are provided, and they are respectively denoted by reference numerals 83B, 84B, and 85B. A set consisting of the substrate 80B, the camera 81B, the mirror 83B, the through hole 84B, and the illumination devices 85B is disposed closer to the center of the base body 61 than a set consisting of the substrate 80A, the camera 81A, the mirror 83A, the through hole 84A, and the illumination devices 85A is. Thus, a region imaged by the camera 81B is located closer to the center side of the base body 61 than a region imaged by the camera 81A. In this way, the multiple cameras are provided at the different positions in the diametrical direction of the base body 61 (that is, so that the distances from the center of the base body 61 are all different), and are arranged to image the different positions in the circumferential direction. The diameter of the annular projection 46 is different for each resist film forming module 3. Between the cameras 81A and 81B, image data acquired from the one located at a position corresponding to the diameter of the annular projection 46 is used to acquire the cup clearance H0.

Provided on the base body 61 is, for example, a circular cover 86 having a sidewall formed along the circumference of the base body 61, and the cover 86 covers the main body 63 of the aforementioned substrate 62, the battery 65, the cameras 81 (81A and 81B), the camera 82, the mirrors 83A and 83B, and the proximity sensors 57. However, in order not to obstruct the imaging of the solvent supply nozzle 51B by the camera 82 and the detection by the proximity sensors 57, the sidewall of the cover 86 is provided with openings on the field of view of the camera 82 and on the optical axes of the proximity sensors 57. Further, in order not to interfere with the transformation of the beam-shaped bodies 66 and 71 described above, a lower end of the sidewall of the cover 86 is notched, for example, and the leading end sides of the beam-shaped bodies 66 and 71 protrude to the outside of the cover 86 to be located at the periphery of the base body 61. Here, in order to suppress the interference with the solvent supply nozzle 51B, a side end of the cover 86 is located closer to the center of the base body 61 than the solvent supply nozzle 51B at the processing position.

In the example shown in FIG. 4 to FIG. 6, a central portion of the cover 86 is higher than a periphery portion of the cover 86, and forms a protruding portion 87 facing upwards. According to this structure of the cover 86, the battery 65 and the component group 64 can be arranged in the central portion of the base body 61 as described above, and the center of the base body 61 can be located in the central portion. Therefore, when the base body 61 is placed on the spin chuck 31, sagging of the base body 61 due to its own weight can be suppressed. Thus, the influence on the measurement result caused by the changes in the heights of the proximity sensors 57, the beam-shaped bodies 66 and 71, and the cameras 81 and 82 due to the sagging and can be suppressed. Thus, the cover 86 provided with the protruding portion 87 contributes to improving the accuracy of the abnormality detection. The cover 76 may be formed to have a relatively large thickness with a top surface formed as a flat surface.

In addition, when the operator handles the inspection wafer 6, such as loading the inspection wafer 6 in the carrier C or performing the maintenance or the like, the inspection wafer 6 may be made to pass through a comparatively narrow area. At this time, since the top surface of the cover 86 is located at a position higher than the beam-shaped bodies 66 and 71, even if the inspection wafer 6 collides with a wall defining the narrow area, it would be the cover 86 that collides with the wall, and the beam-shaped bodies 66 and 71 may be suppressed from colliding with the wall. Thus, since the beam-shaped bodies 66 and 71 are suppressed from undergoing the plastic deformation or being broken, the beam-shaped bodies 66 and 71 can be effectively protected by the cover 86.

Now, the operation unit 9 will be described with reference to FIG. 4. The operation unit 9 is a computer and has a bus 91. A program storage 92, a wireless transmission/reception unit 93, a memory 94, a display 95, and a manipulation unit 96 are respectively connected to the bus 91. A program 90 stored in a recording medium such as a compact disk, a hard disk, a memory card, or a DVD is installed in the program storage 92.

The wireless transmission/reception unit 93 is configured to wirelessly transmit a signal that serves as the trigger for acquiring data to the inspection wafer 6, and wirelessly receives the detection signals from the respective circuits including the aforementioned strain gauges 69 and 73 described above, the image data acquired by the cameras 81 and 82, the detection signals from the proximity sensors 57 and the contact sensor 58. The memory 94 stores therein the data acquired from the sensors and the cameras. In addition, various kinds of data prepared in advance to acquire the clearances H0 and H1, the guide member heights H2 and H3, and so forth, as will be described later, are also stored in the memory 94.

The manipulation unit 96 includes a mouse, a keyboard, or the like, and a user of the information acquisition system 1 can instruct, through the manipulation unit 96, execution of the process that can be performed by the program 90. In addition, the operation unit 9 is connected to the controller 20 of the substrate processing apparatus 2. For example, if the inspection wafer 6 is held by the spin chuck 31, a signal indicating that the acquisition of various kinds of data is possible is transmitted from the controller 20 to the operation unit 9. Furthermore, information upon an instruction position of a motor constituting the lifting device 36 to be described later is also transmitted.

Figure 11:
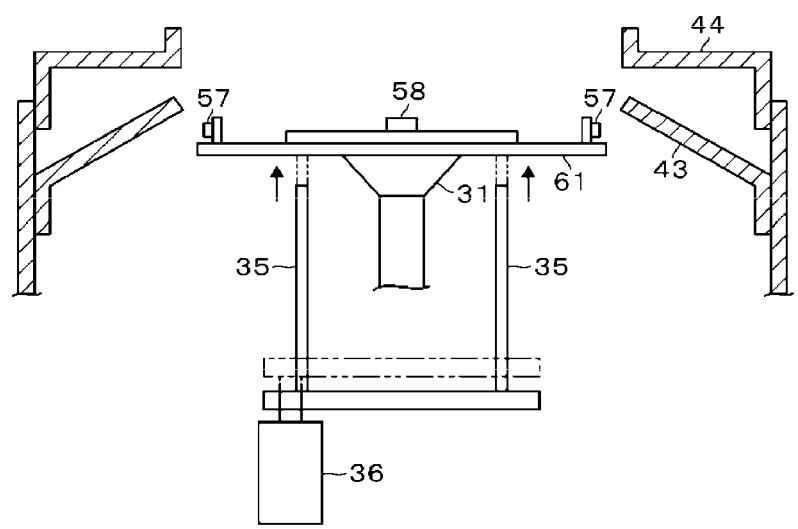
FIG. 11 is an explanatory diagram illustrating a procedure for acquiring information on the module by the inspection wafer.

Now, a method of acquiring the guide member heights H2 and H3 will be explained. The base body 61 of the inspection wafer 6 is placed on the spin chuck 31, and the lift pins 35 are raised from the standby position where they stand by. In response to the detection signal from the contact sensor 58, the instruction position (referred to as a first instruction position) of the motor of the lifting device 36 at the moment when the lift pins 35 come into contact with the base body 61 is specified (FIG. 11, process R1).

Figure 12:
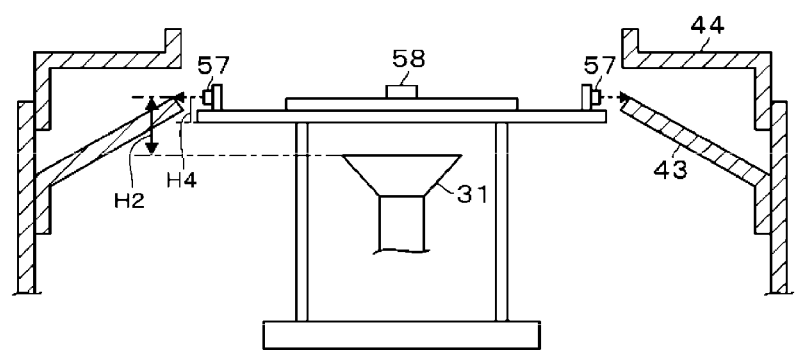
FIG. 12 is an explanatory diagram illustrating the procedure for acquiring the information on the module by the inspection wafer.
Figure 13:
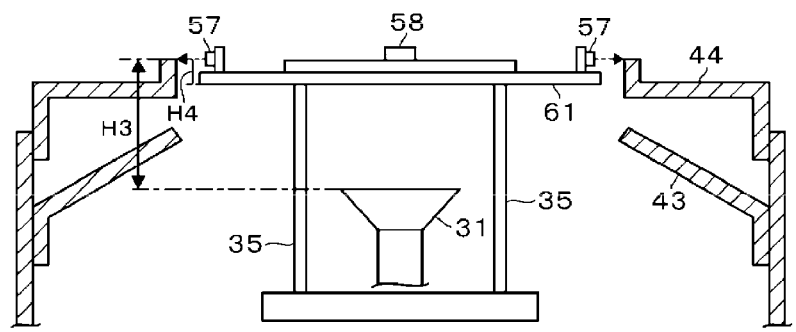
FIG. 13 is an explanatory diagram illustrating the procedure for acquiring the information on the module by the inspection wafer.

Next, in the state that the infrared laser beam is radiated from each proximity sensor 57, the lift pins 35 are further raised. This raising of the lift pins 35 is performed in preset amounts so that the infrared laser beam is radiated to the upper end of the middle guide member 43 as shown in FIG. 12, then radiated to the upper end of the upper guide member 44 as shown in FIG. 13, and then reach a position above the upper end of the upper guide member 44 (process R2).

Based on the detection signals respectively acquired from the proximity sensors 57, a motor instruction position (referred to as a second instruction position) when the laser beam has reached the upper end of the middle guide member 43, and a motor instruction position (referred to as a third instruction position) when the laser beam is located at the upper end of the upper guide member 44 are respectively specified (process R3). Further, the motor is rotated at a certain angle for each inputted pulse, and this rotation angle and the ascending amount of the lift pins 35 correspond to each other. In this way, the motor instruction position is information corresponding to the number of pulses inputted to the motor and corresponding to the height of the lift pins 35. Thus, the identification of the first instruction position in the above-described process R1 corresponds to detection of a contact height where the lift pins 35 and the base body 61 are in contact with each other, and the identification of the second instruction position and the third instruction position corresponds to detection of the height of the upper end of each of the guide members 43 and 44, for example. In addition, in case that an encoder is connected to the motor, the encoder outputs a pulse corresponding to the height of the lift pins 35. Thus, the output from the encoder can be used as the motor instruction position.

Furthermore, the ascending amount of the lift pins 35 per pulse inputted to the motor is already known. When this ascending amount is X mm/pulse, the middle guide member height H2 and the upper guide member height H3 are calculated by the following expressions 1 and 2 (process R4). Further, as the expressions 1 and 2 are calculated by specifying the second instruction position and the third instruction position from the detection signals from the proximity sensors 57A, 57B and 57C, the calculated guide member heights H2 and H3 are calculated for each of the proximity sensors 57A, 57B and 57C. The calculated guide member heights H2 and H3 are displayed on the display 95 (process R5). In addition, in this example, the unit of the heights H2, H3 and H4 is millimeter (mm). Moreover, the above-described processes R1 to R5 are executed by the program 90 of the operation unit 9. In this way, the ascending amount (X mm/pulse) used for the calculation of the guide member heights H2 and H3 and the correction height H4 are acquired in advance and stored in, for example, the memory 94 of the operation unit 9.

Middle guide member height $H2$=(second instruction position−first instruction position)$\times X$+correction height $H4$    Expression 1

Upper guide member height $H3$=(third instruction position−first instruction position)$\times X$+correction height $H4$    Expression 2

The processes R1 to R3 of specifying the first to third instruction positions will be further elaborated. If the lift pins 35 are continuously raised from the standby position by a preset amount, this raising of the lift pins 35 is switched to a stepwise raising according to a resolution of a lifting operation (a minimum amount that can be lifted). That is, the lift pins 35 are operated such that they are raised and stopped temporarily repeatedly in a range as small as possible. As an example, if the lift pins 35 can be lifted in a distance of 0.05 mm or more, the lift pins 35 are raised by 0.05 mm and then stopped. Specifically, if no contact is detected when the lift pins 35 are raised by 0.05 mm and a contact is detected when the lift pins 35 are raised by 0.05 mm more, the number of pulses inputted to the motor at the time when this contact detection is made is set as the first instruction position, and the process R1 is completed. By raising the lift pins 35 step by step by the small distance in this way, the height at which the lift pins 35 come into contact with the base body 61 can be specified by the contact sensor 58 with high accuracy.

Even after the contact is detected as described above, the raising of the lift pins 35 and the stop of the raising are repeated according to the resolution of the lifting operation. When this temporary stop of the raising is performed, infrared rays from the proximity sensors 57 are radiated and the acquisition of the detection signal (sampling) is performed, so that the aforementioned process R2 is carried out. The period of the temporary stop of the raising is set so that the acquisition of this detection signal is performed multiple times. As an example, assuming that an acquisition cycle is 10 milliseconds, the period of the temporary stop of the raising is set to be 1 second, and the acquisition of the detection signal is performed 100 times during each temporary stop of the raising. As stated above, the lift pins 35 are raised until the irradiation position of the infrared rays from the proximity sensor 57 reaches a set height higher than that of the upper guide member 44. The raising of the lift pins 35 according to the resolution and the acquisition of the detection signal during the stop of the raising are repeated until the irradiation position of the infrared rays reach such a height position. In this way, as the inspection wafer 6 is raised or lowered (in this case, raised) by the lift pins 35 and the infrared rays are radiated to different heights, the height detection of the guide members 43 and 44 is carried out.

Figure 14:
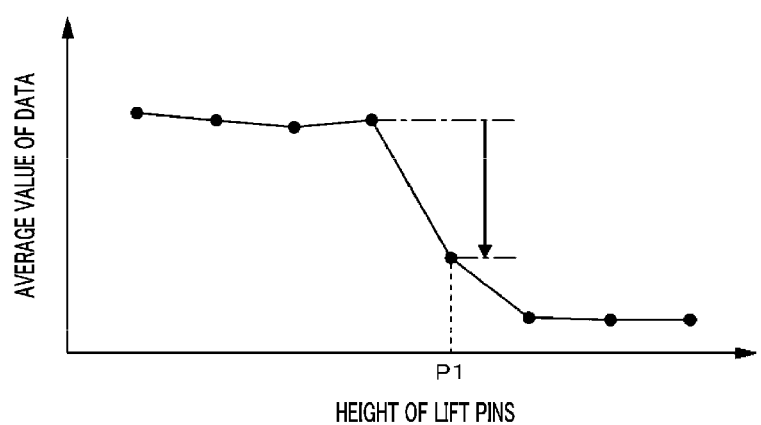
FIG. 14 presents a graph showing an example of data acquired by the inspection wafer.

In specifying the second instruction position and the third instruction position in the process R3, an average value of the acquired data is calculated for each height at which the lift pins 35 are stopped. FIG. 14 presents a graph showing a change in the average value of the data when the leading ends of the lift pins 35 are raised near the upper end of the upper guide member 44. As the infrared rays radiated from the proximity sensors 57 are switched from a state in which they are blocked by the upper guide member 44 into a state in which they are not blocked, the amount of reflection light directed toward the proximity sensors 57 is reduced, and the average value fluctuates greatly. An instruction position corresponding to the height of the lift pins 35 (P1 in on the graph) at which this fluctuation has occurred is set as the third instruction position. The second instruction position can also be decided according to the change of the average value, the same as the third instruction position.

Figure 15:
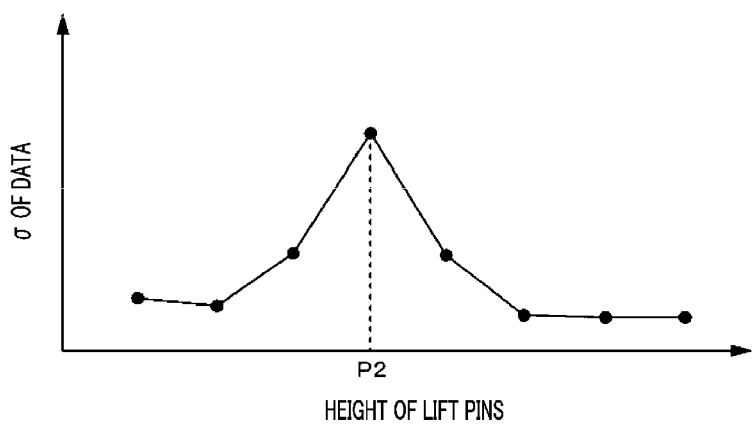
FIG. 15 provides a graph showing an example of data acquire by the inspection wafer.

In addition, without being limited to calculating the average value for the data acquired during the stop of the raising, an index of non-uniformity, as a specific example, sigma ($\sigma$) may be calculated. FIG. 15 is a graph showing a variation of $\sigma$ when the leading ends of the lift pins 35 are raised near the upper end of the upper guide member 44. When the blocked state and the non-blocked state are switched, that is, when the light is radiated from the proximity sensors 57 to the upper end of the upper guide member 44, the light is reflected in a diffused manner, resulting in an increase of non-uniformity in the received light amount. Therefore, an instruction position corresponding to the height (P2 on the graph) of the lift pins 35 at which $\sigma$ is the maximum is set as the third instruction position. The second instruction position can also be determined according to the variation of $\sigma$. Although $\sigma$ is set as the index of non-uniformity, the present disclosure is not limited thereto, a difference between a maximum value and a minimum value of a signal level (that is, a range) is set as the index of non-uniformity, and the heights at which the range peaks may be set as the second instruction position and the third instruction position.

As stated above, by using the detection results from the proximity sensors 57 obtained by raising the lift pins 35 step by step by the small distance, and by using the multiple detection results obtained during the stop of the raising of the lift pins 35, the second instruction position and the third instruction position are detected with high accuracy. Further, in the above-described exemplary embodiment, although the second instruction position and the third instruction position are specified by radiating the infrared rays from the proximity sensors 57 while the inspection wafer 6 is being raised in the preset range, the present disclosure is not limited thereto. By way of example, after the inspection wafer 6 is lifted to a predetermined height by the lift pins 35, the second instruction position and the third instruction position may be specified by radiating the infrared rays from the respective proximity sensors 57 while the inspection wafer 6 is being lowered toward the spin chuck 31 in a preset range.

Figure 16:
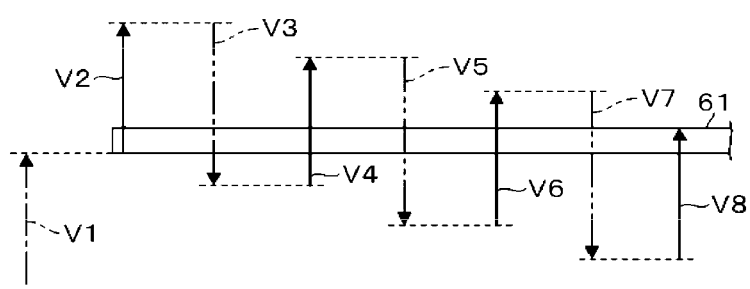
FIG. 16 is an explanatory diagram showing an operation of lift pins in the resist film forming module for acquiring the information.

However, when the resolution of the lifting operation is relatively small, it may be desirable to use a method to be described below instead of the above-described method of using the detection result during the stepwise raising of the lift pins 35 as the method of specifying the first instruction position in the process R1. Assuming that the resolution is, e.g., 0.05 mm, the description will be made with reference to a schematic diagram of FIG. 16. Each arrow in FIG. 16 shows a movement range and a moving direction of the leading ends of the lift pins 35, and indicates a movement after a lapse of a time corresponding to the arrow positioned on the right in time series. As for the movement range for the raising of the lift pins 35, dashed-dotted-lined arrows indicate movement ranges in which no contact is detected, and solid-lined arrows indicate movement ranges in which the contact is detected. Further, the base body 61 in the drawing is shown to be at the height where it is supported by the spin chuck 31.

First, the same as in the above-described example in which the resolution is relatively large, if the lift pins 35 are continuously raised from the standby position by a predetermined amount, this raising of the lift pins 35 is switched to a stepwise raising of, e.g., every 0.2 mm according to the resolution of the lifting operation. In continuing this stepwise raising, assume that a state in which no contact is detected during the ascent of the lift pins 35 is continued in any one ascending range (indicated by an arrow V1), and then this state is switched to a state in which the contact is detected in the next ascending range (indicated by an arrow V2). The lift pins are lowered by a second amount of, e.g., 0.25 mm (indicated by arrow V3) larger than the first distance (0.2 mm) during the raising, and the leading ends of the lift pins 35 are moved to a position lower than the arrow V2. As a result, the contact between the lift pins 35 and the base body 61 is temporarily released.

Thereafter, the lift pins 35 are raised again by 0.2 mm (indicated by an arrow V4). If the state in which no contact is detected is switched to the state in which the contact is detected during this raising, the lift pins 35 are lowered again by 0.25 mm (arrow V5) and then raised by 0.2 mm (arrow V6). If the transition from the state in which no contact is detected to the state in which the contact is detected occurs even during this raising, the lift pins 35 are further lowered by 0.25 mm (arrow V7), and then raised by 0.2 mm (arrow V8). It is assumed that the transition from the state in which no contact is detected to the state in which the contact is detected has also occurred when the lift pins 35 are raised as indicated by the arrow V8.

In this case, when the lowering of the lift pins 35 by 0.25 mm and the raising of the lift pins 35 by 0.2 mm are then repeated, the leading ends of the lift pins 35 are positioned at the height corresponding to a leading end of the arrow V1. That is, since the leading ends of the lift pins 35 are located at a height under a lower end of a height region (one height region) of the arrow V2 where the contact is first detected, the transition from the state in which no contact is detected to the state in which the contact is detected does not take place. Thus, the height of the lift pins 35 when raised as indicated by the arrow V8 is regarded as a height at which contact and non-contact with the base body 61 are switched, and a motor instruction value at this height is specified as the first instruction position.

In repeating the lowering of the lift pins 35 by the second distance and the raising of the lift pins 35 by the first distance after the lift pins 35 are raised as indicated by the arrow V2, assume that the state in which no contact is detected is maintained during the raising of the lift pins 35. In this case, the motor instruction value of the height of the lift pins 35 when raised as stated above is treated as the first instruction value, and the subsequent repetition of the lowering and raising of the lift pins is not performed. As a specific example, it is assumed that no contact is detected when the lift pins 35 are raised as indicated by the arrow V4 in FIG. 17. In this case, the motor instruction value at a time when the lift pins 35 are raised as indicated by the arrow V4 is specified as the first instruction position, and the process R1 is ended, and the raising/lowering operations indicated by the arrows marked by numbers after V5 in FIG. 16 are not performed, and the processing proceeds to the process R2.

Figure 17:
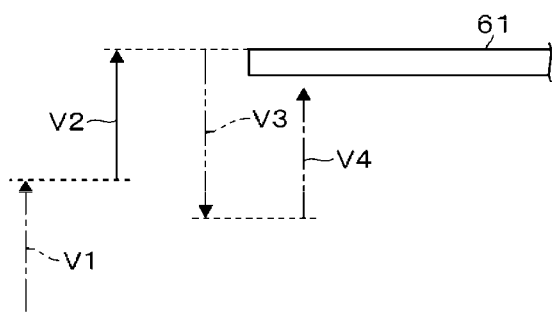
FIG. 17 is an explanatory diagram showing an operation of the lift pins in the resist film forming module for acquiring the information.

By specifying the first instruction position as shown in FIG. 16 and FIG. 17 described above, the accuracy of the first instruction position is high, as compared to a case where the position when the lift pins 35 are raised as indicated by the arrow V2 is set as the first instruction position. Therefore, even if the resolution of the lifting operation of the lift pins 35 is small, that is, even if the minimum lifting amount is of a relatively large value, it is possible to calculate the guide member heights H2 and H3 with high accuracy.

Figure 18:
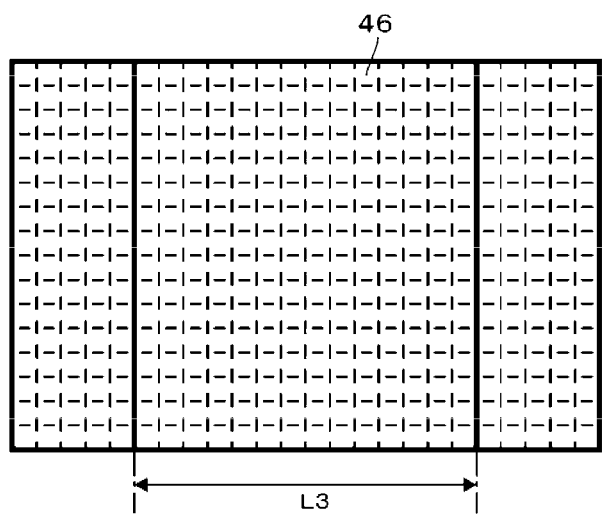
FIG. 18 is an explanatory diagram showing image data acquired by the inspection wafer.

Now, a method of acquiring the cup clearance H0 using the image data acquired from the cameras 81A and 81B and a method of acquiring the nozzle clearance H1 using the image data acquired from the camera 82 will be discussed. FIG. 18 shows image data on a part of the top surface of the annular projection 46 in the circumferential direction, which is imaged by the camera 81A or 81B. Outlines marked by dotted lines indicate pixels of the image. From the image data obtained in this way, the number of pixels of a width L3 of the annular projection 46 is detected (process S1). Based on previously acquired correspondence relationship between the number of pixels of the width L3 and the cup clearance H0, the cup clearance H0 is calculated (process S2). As this correspondence relationship, there may be prepared an equation of any order showing a relationship that the width L3 decreases with an increase of the cup clearance H0 with the cup clearance H0 and the number of pixels of the width L3 as variables. In this way, the cup clearance H0 calculated from the correspondence relationship is displayed on the display 95 of the operation unit 9 (process S3).

Figure 19:
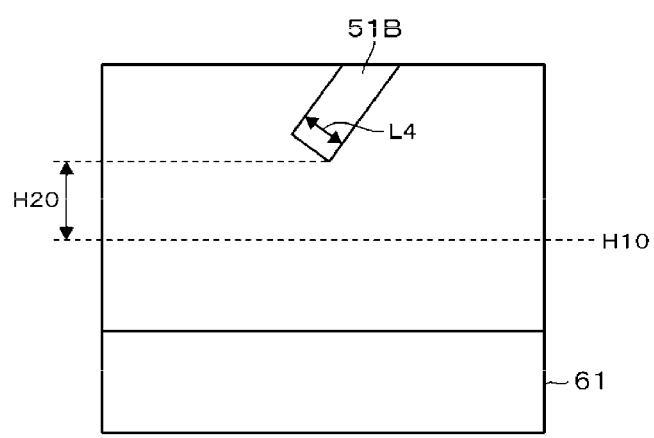
FIG. 19 is an explanatory diagram showing image data acquired by the inspection wafer.

The method of acquiring the nozzle clearance H1 will be explained. FIG. 19 presents image data of a lateral side of the solvent supply nozzle 51B imaged by the camera 82. In the image data, the number of pixels corresponding to a width L4 of the solvent supply nozzle 51B is detected (process T1). Then, in the image data, the number of pixels at a height H20 between a lower end of the solvent supply nozzle 51B specified in the process T1 and a reference height H10 (a pixel of a preset height in the image data) is detected (process T2). The height H20 is referred to as a nozzle reference height. Thereafter, calculation on the width L4 of the solvent supply nozzle 51B obtained in advance/the number of pixels corresponding to the width L4 of the solvent supply nozzle 51B obtained in the process T1 is performed, and the calculated value is regarded as a distance in one pixel (process T3). Then, a product of the number of pixels at the nozzle reference height H20 obtained in the process T2 and the distance in one pixel obtained in the process T3 is calculated. That is, conversion into an actual height (distance) is performed with respect to the nozzle reference height H20, which is the number of pixels on the image data (process T4).

A height difference H30 between the front surface of the wafer W when the wafer W is attracted to and held by the spin chuck 31 and the aforementioned reference height H10 in the image acquired by the camera 82 when the inspection wafer 6 is attracted to and held by the spin chuck 31 is previously obtained. Based on the actual nozzle reference height H20 obtained in the process T4 and the height difference H3, the nozzle clearance H1 is calculated (process T5). Specifically, the nozzle clearance H1 is calculated to be H20+H30 when the nozzle 51B is shown above the reference height H20 in the image as shown in FIG. 19, whereas the nozzle clearance H1 is calculated to be H30-H20 when the nozzle 51B is shown below the reference height H20. The calculated nozzle clearance H1 is displayed on the display 95 of the operation unit 9 (process T6). The reason for using the previously acquired height difference H30 in this way is because the field of view of the camera 82 is limited as it is provided on the base body 61.

The above-described processes S1 to S3 and T1 to T6 are performed by the program 90 of the operation unit 9. The correspondence relationship between the number of pixels of the width L3 and the cup clearance H0, the height difference H30, and the actual width L4 of the solvent supply nozzle 51B are stored in the memory 94 of the operation unit 9 in advance.

An example operation sequence of the information acquisition system 1 described above will be explained. In this example operation sequence, the detection of the cup clearance H0 and the nozzle clearance H1 by the cameras 81 and 82 described in FIG. 18 and FIG. 19 is not performed. First, the carrier C in which the inspection wafer 6 is stored is transferred to the stage 21 of the substrate processing apparatus 2. The inspection wafer 6 is transferred in the order of the transfer device 23→the transfer module TRS→the transfer device 25→the resist film forming module 3, and is placed on the spin chuck 31 via the lift pins 35 to be attracted to and held by the spin chuck 3.

For example, when the operator gives a predetermined instruction from the operation unit 9, the above-described processes R1 to R3 shown in FIG. 11 to FIG. 13 are performed, and the middle guide member height H2 and the upper guide member height H3 are acquired from each of the proximity sensors 57A to 57C. The acquired heights H2 and H3 are stored in the memory 94 of the operation unit 9 and displayed on the display 95. Thereafter, if the lift pins 35 are lowered and the inspection wafer 6 is attracted to the spin chuck 31 again, the solvent supply nozzle 51B is moved from the standby member 55B to the processing position. The inspection wafer 6 is rotated one round by the spin chuck 31. During this rotation, the detection signals from the respective circuits including the strain gauges 69 and 73 are transmitted to the operation unit 9 to be stored in the memory 94, and waveforms thereof are displayed on the display 95. After the inspection wafer 6 is rotated one round, the solvent supply nozzle 51B is returned to the standby member 55B. Then, the inspection wafer 6 is transferred to the transfer device 25 via the lift pins 35, and is returned back into the carrier C via the transfer module TRS and the transfer device 23 in sequence.

The operator determines whether or not all of the three values of the middle guide member height H2 and the three values of the upper guide member height H3 are within allowable ranges. Furthermore, the operator also determines whether the waveforms of the detection signals respectively acquired from the strain gauges 69 and 73 are normal. As a specific example, this waveform determination is carried out through comparison with reference data which is acquired by rotating spin chuck 31 holding the inspection wafer 6 thereon one round under the condition that interference between the solvent supply nozzle 51B and the annular projection 46 and the beam-shaped bodies 66 and 71 do not occur.

The operator corrects the mounting of the middle guide member 43 and/or the upper guide member 44 when any one of the guide member heights H2 and H3 is out of the allowable ranges. In addition, when the waveform of the detection signal from the strain gauge 69 and/or the strain gauge 73 is abnormal, height adjustment of the lower guide member 42 provided with the annular projection 46 and/or the solvent supply nozzle 51B is performed.

Then, the carrier C in which the wafer W is stored is transferred to the stage 21 of the substrate processing apparatus 2. The wafer W is transferred in the order of the transfer mechanism 23→the transfer module TRS→the transfer device 25→the resist film forming module 3→the transfer device 25→the heating module 26→the transfer device 25→the transfer module TRS, and is returned to the carrier C by the transfer device 23. During this transfer, in the resist film forming module 3, the resist is discharged from the resist supply nozzle 51A on the center of the front surface of the wafer W being rotated by the spin chuck 31, and the resist film is formed on the entire front surface of the wafer W by spin coating. Thereafter, the solvent supply nozzle 51B is moved from the standby member 55B to the processing position, and the solvent is supplied to the periphery of the wafer W being rotated, so that the resist film on the periphery is removed.

Next, a case of performing acquisition of the clearances H0 and H1 by the cameras 81 and 82, instead of the interference detection by the beam-shaped bodies 66 and 71, for the inspection wafer 6 will be explained, focusing on differences from the above-described operation sequence. By way of example, after the lift pins 35 lift up the inspection wafer 6 and the guide member heights H2 and H3 are acquired, the lift pins 35 are lowered, and the inspection wafer 6 is attracted to the spin chuck 31 again. Then, after the solvent supply nozzle 51B is moved to the processing position, the spin chuck 31 is intermittently rotated at a predetermined angular interval, for example, and when the rotation is stopped, imaging by the camera 81A or 81B and the camera 82 is performed to acquire image data. The acquired image data are wirelessly transmitted to the operation unit 9 in sequence.

For each image data acquired by the camera 81 (81A and 81B), the above-described processes S1 to S3 are performed, and the cup clearance H0 is calculated and displayed on the screen. Further, to perform the calculation of the cup clearance H0, it may be decided which one of the cameras 81A and 81B is to be used, the imaging may be performed only by that camera or the images may be acquired by both cameras, and the image in which the annular projection 46 is shown may be selected by the program 90. Moreover, among multiple images acquired by the camera 82, the one in which the solvent supply nozzle 51B is shown as illustrated in FIG. 19 is selected by the program 90 of the operation unit 9, for example. Then, the above-described processes T1 to T6 are performed on the selected image data, and the nozzle clearance H1 is calculated and displayed on the screen. The operator who has checked the displayed heights H0 and H1 performs the height adjustment of the annular projection 46 and/or the nozzle 51B when necessary.

Although the acquisition of the clearances H0 and H1 by the cameras 81 and 82 and the detection of the interference by the beam-shaped bodies 66 and 71 are selectively performed, both may be performed. Further, although each abnormality determination based on the acquired guide member heights H2 and H3, the clearances H0 and H1, and the signal waveforms from the strain gauges 69 and 73 of the beam-shaped bodies 66 and 71 has been described to be performed by the operator, the program 90 may perform the abnormality determination through the comparison with individual values stored in the memory 94 and/or the reference data regarding the signal waveforms. In that case, if the program 90 makes a determination that abnormality exists, a predetermined mark may be displayed on the display 95 or a predetermined sound may be outputted from a speaker of the operation unit 9, as an alarm.

By using the inspection wafer 6 as described above, the guide member heights H2 and H3 can be acquired at the three different positions of the cup 4 in the circumferential direction. As described above, by acquiring the heights at the multiple positions in this way, the influence of the inclination of the upper guide member 44 and the middle guide member 43 with respect to the spin chuck 31 is suppressed, and the abnormality in the heights of the upper guide member 44 and the middle guide member 43 can be detected with high accuracy. Therefore, since it is possible to suppress the processing on the wafer W from becoming abnormal, it is possible to suppress the decrease in the yield of semiconductor products fabricated from the wafer W.

Further, it is assumed that the inspection wafer 6 is held on the spin chuck 31 such that the center of the inspection wafer 6 is eccentric with respect to the center of the spin chuck 31. Assume that due to this eccentric holding, distances from one of the proximity sensors 57 to the opening edges of the middle guide member 43 and the upper guide member 44 are increased, causing deterioration of the detection accuracy or occurrence of the state in which the detection is impossible. However, since the multiple proximity sensors 57 are provided, the detection can be performed by using another proximity sensor 57. Furthermore, as described in FIG. 9, the proximity sensors 57 are respectively arranged in the one region and the other region divided by the imaginary line 6A. As stated above, this layout is effective to suppress the influence of the inclination between the guide members 43 and 44 and the spin chuck 31. Here, however, this layout is also effective in suppressing the aforementioned eccentricity between the spin chuck 31 and the inspection wafer 6. Even if the detection accuracy deteriorates as the proximity sensor 57 in the one area is distanced apart from the opening edges of the guide members 43 and 44 due to the eccentricity, the proximity sensor 57 in the other region becomes closer to the opening edges of the guide members 43 and 44, so the detection can be performed securely. Furthermore, the number of the proximity sensors 57 is not limited to the aforementioned example, but it may be two or more than three.

In the inspection wafer 6, the proximity sensors 57, the cameras 81 and 82, and the beam-shaped bodies 66 and 71 are arranged on the common base body 61 while being deviated from each other in the circumferential direction. With this layout, the detection of the interference between the nozzle and the annular projection 46 and the acquisition of the clearances H0 and H1 as well as the acquisition of the guide member heights H2 and H3 can be carried out by using the components individually. Therefore, since these information can be obtained by transferring the inspection wafer 6 to the resist film forming module 3 once, the time required for the inspection can be shortened, which is advantageous.

Figure 20:
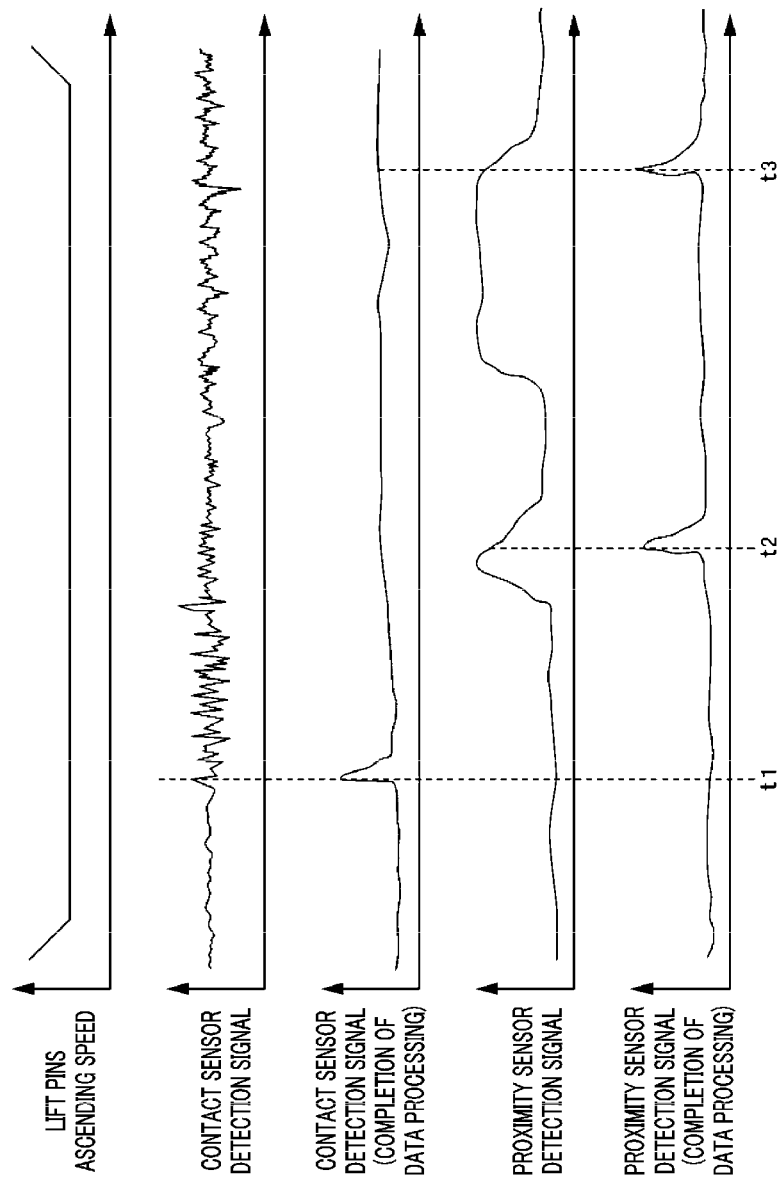
FIG. 20 is a graph showing data acquired by the inspection wafer.

Now, in acquiring the guide member heights H2 and H3, an example different from the example where the processes R1 and R5 are performed will be explained below. In this acquisition example, the lift pins 35 are continuously raised at a relatively low speed, unlike the above-described example in which the lift pins 35 are raised step by step. Hereinafter, with reference to FIG. 20, this different acquisition example will be described, focusing on the difference from the case where the lift pins 35 are raised step by step. FIG. 20 is a timing chart which shows changes in an ascending speed of the lift pins 35, the detection signal from the contact sensor 58, and the detection signal from one of the three proximity sensors 57. Further, this chart also shows signal waveforms obtained by processing the respective detection signals from the contact sensor 58 and the proximity sensor 57 with a predetermined algorithm. This signal processing is performed by, for example, the operation unit 9 which receives the detection signal. Here, a data sampling rate of both the contact sensor 58 and the proximity sensor 57 is set to be 10 msec.

First, the inspection wafer 6 is held by the spin chuck 31, and the light is radiated thereto from the proximity sensors 57. Then, the lift pins 35 are raised from the standby position, and if they are raised by the predetermined amount, the ascending speed is reduced, and the lift pins 35 are moved at, e.g., 0.2 mm/sec. If the inspection wafer 6 is raised by a predetermined amount as the lift pins 35 come into contact with the inspection wafer 6 and lifts up the inspection wafer 6, the low-speed ascending of 0.2 mm/sec is stopped. The height at which this low-speed ascending is stopped is a height at which the irradiation position of the infrared rays by the proximity sensor 57 is located above the upper guide member 44 in design. In this way, the detection signals are acquired from the contact sensor 58 and the proximity sensors 57 while the lift pins 35 are being raised.

A peak of the waveform of the detection signal of the contact sensor 58 upon the completion of the data processing is detected. In the graph, the time at which the peak is detected is indicated as t1. Moreover, a peak of the waveform of the detection signal of the proximity sensor 57 upon the completion of the data processing is also detected. A peak appearing at an early time is a peak corresponding to the upper end of the middle guide member 43, and a peak appearing at a later time is a peak corresponding to the upper end of the upper guide member 44. In the graph, the time at which the peak corresponding to the upper end of the middle guide member 43 appears and the time at which the peak corresponding to the upper end of the upper guide member 44 appears are respectively indicated as t2 and t3. From the sampling rate of each sensor and the ascending speed of the lift pins 35 described above, a distance by which the lift pins 35 are raised after the detection signal is acquired at a certain time point until the detection signal is detected next time is 0.002 mm.

Thus, the guide member heights H3 and H4 can be calculated from the following expressions 3 and 4. In the expressions 3 and 4, the unit of each of H2 to H4 is millimeter (mm). When the guide member heights H2 and H3 are acquired in this way, since it is unnecessary to specify the motor instruction position described to be performed in the processes R1 to R5, the acquisition of the motor instruction position is not essential to obtain the guide member heights H2 and H3.

Middle guide member height $H2$=(the number of data at times $t1$ to $t2-1$)×0.002+correction height $H4$      Equation 3

Upper guide member height $H3$=(the number of data at times $t1$ to $t3-1$)×0.002+correction height $H4$      Equation 4

Figure 3:
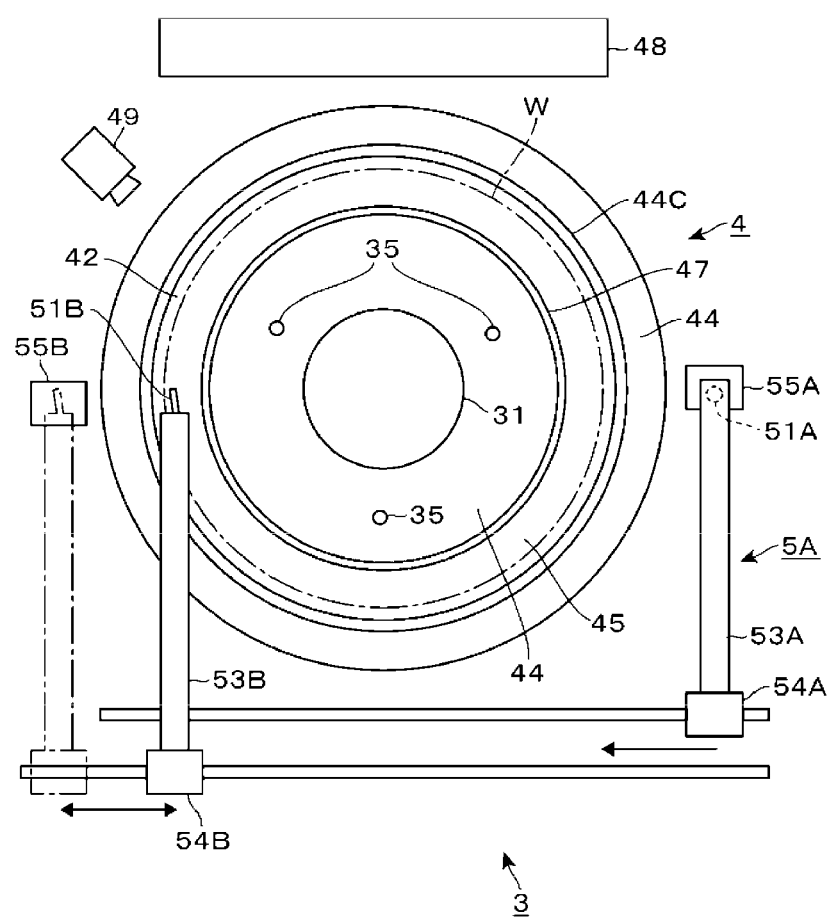
FIG. 3 is a plan view of the resist film forming module.
Figure 21:
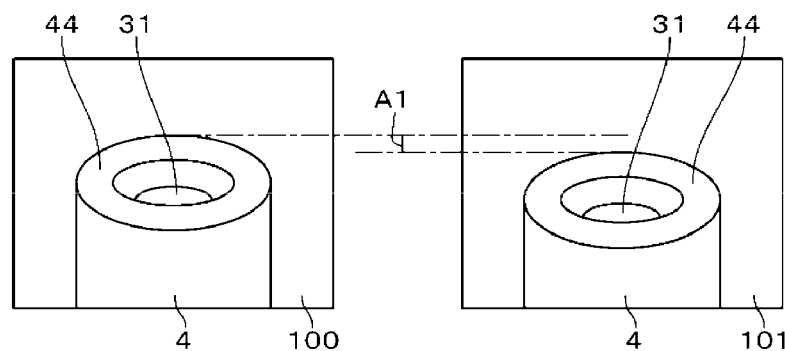
FIG. 21 is an explanatory diagram showing image data acquired by a camera provided in the resist film forming module.

Here, as shown in FIG. 3, the resist film forming module 3 is equipped with the camera 49 configured to image the upper guide member 44. In FIG. 21, image data 100 acquired by the camera 49 is shown, and this image data 100 is image data for the upper end of the cup 4, that is, the upper guide member 44. For example, this image data 100 is acquired at a certain timing, and compared with previously acquired reference image data 101. The reference image data 101 is image data acquired as the camera 49 images the upper guide member 44 in the state that each portion of the upper guide member 44 is at the normal height. Then, a difference A1 in the height of the upper guide member 44 between the image data 100 and the reference image data 101 is acquired. This difference A1 is compared with a reference value, and when it exceeds a reference value, it is assumed that there is something abnormal.

However, if the upper guide member heights H3 obtained from the three proximity sensors 57 are all normal as described in FIG. 11 to FIG. 13, it is determined that there is no abnormality in the height of the upper guide member 44. That is, only when both the upper guide member height H3 and the difference A1 are abnormal, there is made a determination that the height of the upper guide member 44 is abnormal. The image data 100 is transmitted to, for example, the operation unit 9, and the reference image data 101 is stored in the memory 94. The program 90 of the operation unit 9 serving as an information acquisition unit makes this abnormality determination. This abnormality determination corresponds to acquisition of information about the position of the cup 4.

Further, such a determination is an example, and if either one of the difference A1 or the upper guide member height H3 is abnormal, it may be considered that the height of the upper guide member 44 is abnormal. As stated above, by using both the image data 100 obtained from the camera 49 and the upper guide member height H3 obtained from the respective proximity sensors 57, that is, data with different viewpoints or fields of view for the same target object as a data capable of detecting the abnormality, it is possible to detect the abnormality with higher accuracy.

Moreover, in the above-described exemplary embodiment, the contact sensor 58 configured to detect the contact between the lift pins and the base body 61 is the acceleration gyro sensor. However, the contact sensor 58 is not limited to the acceleration gyro sensor as long as it is capable of detecting the corresponding contact. By way of non-limiting example, a sensor having a function of only one of the acceleration sensor and the gyro sensor may be used, or a vibration sensor may be used. As described above, one capable of detecting the difference in movement and posture of the inspection wafer 6 immediately before and after such contact may be used as the contact sensor 58.

Figure 22:
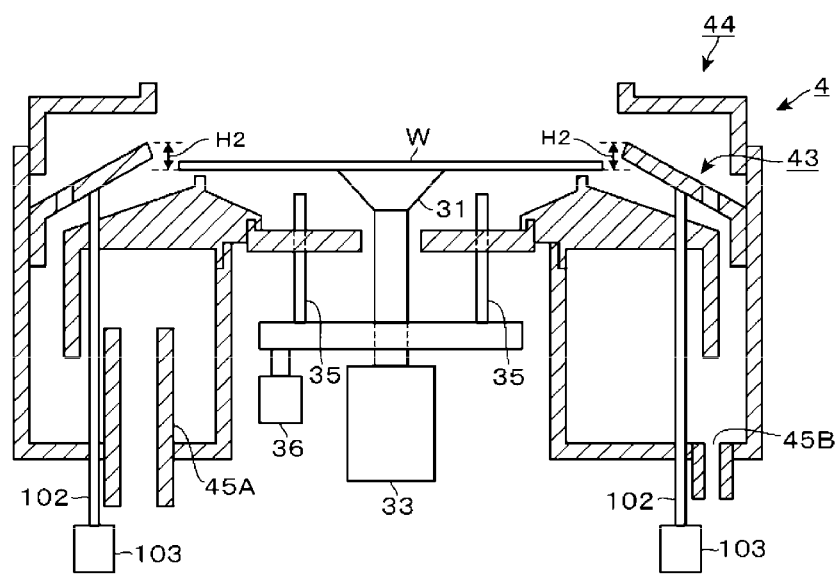
FIG. 22 is an explanatory diagram showing an example of a cup provided in the resist film forming module.

FIG. 22 illustrates a modification example of the cup 4. The middle guide member 43 is supported by three posts 102 (only two are shown in the drawing) at different positions in the circumferential direction thereof. The three posts 102 are equi-spaced in the circumferential direction of the cup 4, and lower ends of these posts 102 are connected to a lifting device 103 through the bottom of the cup 4. The posts 102 can be moved up and down independently. The height and the inclination of the upper guide member 44 of the cup main body 41 can be adjusted by moving each post 102 up and down.

For example, by orienting the inspection wafer 6 toward a preset direction when the inspection wafer 6 is carried into the apparatus, detection positions of the upper guide member 44 by the proximity sensors 57A to 57C are set to be the positions respectively supported by the posts 102. If the middle guide member height H2 detected by each of the proximity sensors 57A to 57C has an abnormal value, the post 102 located at the position detected by the proximity sensor 57 having the abnormal value is raised or lowered as much as a difference between the abnormal value and the allowable value. Accordingly, the middle guide member height H2 falls within the allowable range, and the abnormality is eliminated. The upper guide member 44 may have the same configuration as the middle guide member 43 of this example to eliminate the abnormality in height, if any.

In the above-described information acquisition system 1, the controller 20 and the operation unit 9 are provided separately. However, the controller 20 may be configured to perform the function of the operation unit 9 as well. Further, although each data is transmitted wirelessly to the operation unit 9 in the above-described exemplary embodiment, a removable memory may be mounted on the base body 61 of the inspection wafer 6, and each data may be stored in that memory, for example. In this case, the operator needs to separate the memory from the inspection wafer 6 returned to the carrier C after completing the data acquisition, and transfer each data to the operation unit 9. Thus, the inspection wafer 6 need not necessarily be configured to wirelessly transmit the image data. Moreover, there may be adopted a configuration in which the inspection wafer 6 are connected to the operation unit 9 by a wire to transmit various kinds of data to the operation unit 9.

The inspection wafer 6 is configured such that each proximity sensor 57 is disposed on the base body 61 at the height corresponding to the lower end of the nozzle 51B at the processing position. The inspection wafer 6 is rotated one round along with the spin chuck 31, and it is determined whether the solvent supply nozzle 51B is detected by each proximity sensor 57. As described above, there are cases where the spin chuck 31 is inclined. Thus, even if the solvent supply nozzle 51B is not detected by one of the plurality of proximity sensors 57, it is determined that the height of the solvent supply nozzle 51B is normal if the solvent supply nozzle 51B is detected by another sensor. Meanwhile, if the solvent supply nozzle 51B is not detected by all of the plurality of proximity sensors 57, it is determined that the height of the nozzle 51B is abnormal. As stated, the multiple proximity sensors 57 are not limited to being used to detect the abnormality in the height of the cup 4. Furthermore, the proximity sensor 57 is not limited to be of the type that radiates light, such as infrared rays, to detect the object. For example, one configured to detect the object by outputting an ultraviolet wave may be used instead as the proximity sensor 57.

Although the camera 82 is configured to image the solvent supply nozzle 51B, it may be configured to image the resist supply nozzle 51A to acquire a distance between the resist supply nozzle 51A and the front surface of the wafer W. Further, the liquid processing module provided in the substrate processing apparatus 2 is not limited to the resist film formation module 3. The liquid processing module may be a module configured to form a film by supplying a processing liquid for forming a coating film other than the resist film, such as an antireflection film or an insulating film, onto the front surface of the wafer W from a nozzle, or may be a module configured to supply a cleaning liquid, a developer, or an adhesive for attaching a plurality of wafers W to each other from a nozzle. Information on the height between the nozzle for supplying the processing liquid other than the resist and the front surface of the wafer W can also be obtained by the method of the above-described exemplary embodiment.

Additionally, the processing liquid supplied from the nozzle to the periphery of the wafer W is not limited to the solvent, but it may be, for example, a coating liquid for forming a coating film. Information about the height between this nozzle and the front surface of the wafer W can be acquired by the above-described methods. Further, the inspection wafer 6 is not limited to being transferred to the substrate processing apparatus 2 from the outside by the carrier C. For example, a module configured to store the inspection wafer 6 may be provided in the substrate processing apparatus 2, and the inspection wafer 6 may be transferred between this module and the resist film forming module 3.

It should be noted that the above-described exemplary embodiment is illustrative in all aspects and is not anyway limiting. The above-described exemplary embodiment may be omitted, replaced and modified in various ways without departing from the scope and the spirit of claims.

According to the exemplary embodiment, it is possible to suppress the occurrence of the problem in the processing that may be caused when the member near the substrate to be processed in the substrate processing apparatus is disposed at the inappropriate position.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. An information acquisition system configured to acquire information upon a substrate processing apparatus configured to process a substrate held by a substrate holder, the information acquisition system comprising: a base body, instead of the substrate, held by the substrate holder; and multiple position sensors provided at the base body such that detection directions thereof are different from each other, and each configured to detect a position of a common detection target object located outside the base body;

wherein a support configured to support the base body is raised or lowered by the lifting device under the base body held by the substrate holder, and in order to detect the position of the detection target object, the base body is provided with a contact sensor configured to detect a contact between the base body and the support to detect a contact height where the support and the base body held by the substrate holder are in contact with each other;

wherein when the contact by the contact sensor is detected while the support is being raised in one height region of a first size, the contact height is acquired by repeating lowering the support by a second size and subsequently raising the support by the first size, the second size being larger than the first size, until detection of the contact is not performed during the raising or until a height of the support when the support is raised by the first size next time becomes a height on a level with or below the one height region.

2. The information acquisition system of claim 1, wherein the base body is of a circular shape, the multiple position sensors are respectively disposed in a first region and a second region divided by an imaginary line along a diameter of the base body, and the detection direction of each of the multiple position sensors is directed outwards in a diametrical direction of the base body.

3. The information acquisition system of claim 1, wherein the base body is raised or lowered by a lifting device, and position detections are performed by the respective position sensors at different heights.

4. The information acquisition system of claim 1, wherein the detection target object is a cup surrounding the substrate, and the information acquisition system comprises an information acquisition unit configured to acquire information upon a position of the cup based on image data acquired by imaging the cup with a first imaging device and acquisition results by the multiple position sensors.

5. The information acquisition system of claim 1, wherein the base body is of a circular shape, and a second imaging device, which is configured to image a nozzle located above a periphery of the substrate to supply a processing liquid onto the periphery of the substrate from a center side of the base body, is provided between a first one of the multiple positions sensors and a second one of the multiple position sensors in a circumferential direction of the base body.

6. The information acquisition system of claim 1, wherein the base body is of a circular shape, and an interference detector, which is partially fixed to the base body and configured to detect interference with an interference detection target member by being transformed when the interference with the interference detection target member occurs, is provided at a position deviated from the multiple position sensors in a circumferential direction of the base body.

7. The information acquisition system of claim 6, wherein a cover configured to cover the multiple position sensors is provided on the base body, the interference detector is provided at a periphery of the base body to be located outside the cover, and a top surface of the cover is higher than the interference detector on the base body.

8. An information acquisition method of acquiring information upon a substrate processing apparatus configured to process a substrate held by a substrate holder, the information acquisition method comprising: holding a base body, instead of the substrate, by the substrate holder; and detecting, by using multiple position sensors provided at the base body such that detection directions thereof are different from each other, a position of a common detection target object located outside the base body;

wherein a support configured to support the base body is raised or lowered by the lifting device under the base body held by the substrate holder, and in order to detect the position of the detection target object, the base body is provided with a contact sensor configured to detect a contact between the base body and the support to detect a contact height where the support and the base body held by the substrate holder are in contact with each other;

wherein when the contact by the contact sensor is detected while the support is being raised in one height region of a first size, the contact height is acquired by repeating lowering the support by a second size and subsequently raising the support by the first size, the second size being larger than the first size, until detection of the contact is not performed during the raising or until a height of the support when the support is raised by the first size next time becomes a height on a level with or below the one height region.

9. The information acquisition method of claim 8, further comprising:

raising or lowering the base body by a lifting device, wherein position detections by the multiple position sensors are performed at different heights.

10. The information acquisition method of claim 9, wherein a support configured to support the base body is raised by the lifting device under the base body held by the substrate holder, and a contact height, where a contact between the support and the base body held by the substrate holder is detected, is detected by a contact sensor provided at the base body, and a position of the detection target object is acquired based on the contact height.

11. The information acquisition method of claim 10, wherein when the contact by the contact sensor is detected while the support is being raised in one height region of a first size, the contact height is acquired by repeating lowering the support by a second size and subsequently raising the support by the first size, the second size being larger than the first size, until detection of the contact is not performed during the raising or until a height of the support when the support is raised by the first size next time becomes a height on a level with or below the one height region.

* * * * *